US009966955B2

United States Patent
Dey et al.

(10) Patent No.: US 9,966,955 B2
(45) Date of Patent: May 8, 2018

(54) OVERDRIVE RECEIVER CIRCUITRY

(71) Applicant: ARM Limited, Cambridge (GB)

(72) Inventors: Ranabir Dey, Bangalore (IN); Vijaya Kumar Vinukonda, Bangalore (IN); Mikael Rien, Grenoble (FR); Vikas Murli Kyatsandra, Bangalore (IN)

(73) Assignee: ARM Limited, Cambridge (GB)

( * ) Notice: Subject to any disclaimer, the term of this patent is extended or adjusted under 35 U.S.C. 154(b) by 0 days. days.

(21) Appl. No.: 15/331,536

(22) Filed: Oct. 21, 2016

(65) Prior Publication Data

US 2017/0041002 A1   Feb. 9, 2017

Related U.S. Application Data

(63) Continuation-in-part of application No. 14/814,029, filed on Jul. 30, 2015.

(30) Foreign Application Priority Data

Jul. 30, 2014  (GB) .................................. 1413490.2

(51) Int. Cl.
*H03K 19/0175* (2006.01)
*H03K 19/003* (2006.01)
(Continued)

(52) U.S. Cl.
CPC ............. *H03K 19/017509* (2013.01); *H03K 19/00315* (2013.01); *H03K 19/018521* (2013.01); *H03K 19/0948* (2013.01)

(58) Field of Classification Search
CPC ............ H02M 3/155; H03K 3/356104; H03K 19/018521; H03K 19/0027; H03K 19/018585; H03K 19/00315
(Continued)

(56) References Cited

U.S. PATENT DOCUMENTS 6,084,430 A   7/2000   Wayner
6,147,540 A   11/2000  Coddington
(Continued)

FOREIGN PATENT DOCUMENTS

EP   2680441 A2   1/2014

OTHER PUBLICATIONS

UKIPO Search Report; GB 1413490.2; dated Jan. 14, 2015.
(Continued)

*Primary Examiner* — Alexander H Taningco
*Assistant Examiner* — Seokjin Kim
(74) *Attorney, Agent, or Firm* — Pramudji Law Group PLLC; Ari Pramudji

(57) ABSTRACT

Various implementations described herein are directed to an integrated circuit. The integrated circuit may include signal generation circuitry that receives an input signal from a first voltage domain and generates multiple internal signals based on the input signal. The integrated circuit may include signal evaluation circuitry that receives the multiple internal signals from the signal generation circuitry and provides an intermediate signal based on the multiple internal signals. The integrated circuit may include signal conversion circuitry that receives the intermediate signal and provides an output signal for a second voltage domain based on the intermediate signal. The integrated circuit may include signal protection circuitry that receives the input signal from the first voltage domain, receives the intermediate signal from the signal evaluation circuitry, and allows the input signal until the intermediate signal transitions between a first state and a second state that is different than the first state.

22 Claims, 19 Drawing Sheets

(51) Int. Cl.
*H03K 19/0948* (2006.01)
*H03K 19/0185* (2006.01)

(58) Field of Classification Search
USPC .............. 326/62–81, 21–34, 56–58; 327/333
See application file for complete search history.

(56) References Cited

U.S. PATENT DOCUMENTS

| | | |
|---|---|---|
| 6,346,829 B1 | 2/2002 | Coddington |
| 6,965,251 B1 | 11/2005 | Tran et al. |
| 7,173,472 B2 | 2/2007 | Chen et al. |
| 8,258,848 B2 | 9/2012 | Chen |
| 8,598,936 B2 | 12/2013 | Kuge |
| 2006/0255835 A1 | 11/2006 | Cordoba |
| 2010/0264976 A1* | 10/2010 | Duby ................ H03K 5/08 327/333 |
| 2011/0102383 A1 | 5/2011 | Cho |
| 2012/0133416 A1 | 5/2012 | Ogawa |
| 2014/0002146 A1 | 1/2014 | Kim |
| 2014/0097888 A1 | 4/2014 | Lee |
| 2016/0036441 A1 | 2/2016 | Dey et al. |
| 2016/0211847 A1 | 7/2016 | Duby et al. |

OTHER PUBLICATIONS

Annema, et al; "5.5-V I/O in a 2.5-V 0.25-m CMOS Technology"; IEEE Journal of Solid-State Circuits; vol. 36, No. 3; pp. 528-538; Mar. 2001.

UKIPO Search Report; GB 1413492.8; dated Jan. 13, 2015.

Lee, et al.; Wide-Range 5.0/3.3/1.8-V I/O Buffer Using 0.35-μm 3.3-V CMOS Technology; IEEE Transactions on Circuits and Systems I, Regular Papers; vol. 56, No. 4; Apr. 2009.

Chen, et la.; An Output Buffer for 3.3-V Applications in a 0.13-μm 1/2.5-V CMOS Process; IEEE Transactions on Circuits and Systems II, Express Briefs; vol. 54, No. 1; Jan. 2007.

\* cited by examiner

| DVDD | HYS | VIH | Spec VIH | VIL | Spec VIL | Hysteresis | Spec Hysteresis |
|---|---|---|---|---|---|---|---|
| 3.3V | ON | 1.65 | 2.0 | 0.833 | 0.8 | 171mV | 165mV |
| 2.5V | | 1.42 | 1.7 | 0.82 | 0.7 | 190mV | 165mV |
| 1.8V | | 0.60*DVDD | 0.65*DVDD | 0.39*DVDD | 0.35*DVDD | 169.2mV | 165mV |
| 3.3V | OFF | 1.34 | 2.0 | 0.91 | 0.8 | | |
| 2.5V | | 1.23 | 1.7 | 0.91 | 0.7 | | |
| 1.8V | | 0.55*DVDD | 0.65*DVDD | 0.45*DVDD | 0.35*DVDD | | |

FIG. 8

OVERDRIVE RECEIVER CIRCUITRY

RELATED PATENT APPLICATION

This non-provisional utility patent application is a continuation-in-part of U.S. patent application Ser. No. 14/814,029, filed Jul. 30, 2015, and titled RECEIVER CIRCUITRY AND METHOD FOR CONVERTING AN INPUT SIGNAL FROM A SOURCE VOLTAGE DOMAIN INTO AN OUTPUT SIGNAL FOR A DESTINATION VOLTAGE DOMAIN, which claims priority to UK Patent Application Serial No. 1413490.2, filed Jul. 30, 2014, and titled RECEIVER CIRCUITRY AND METHOD FOR CONVERTING AN INPUT SIGNAL FROM A SOURCE VOLTAGE DOMAIN INTO AN OUTPUT SIGNAL FOR A DESTINATION VOLTAGE DOMAIN, each of which are incorporated herein by reference in their entirety.

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

Conventional receiver circuitry may operate from a supply voltage that matches a "native voltage" (e.g., a "technology limit value") of components within the receiver circuitry. Sometimes, a voltage drop across terminals of the components of the receiver circuitry may be lower than the native voltage so as to inhibit damage due to overstress, which may lead to ensured reliability. For instance, if the receiver circuitry is implemented with CMOS devices with a native voltage of 1.8V, the receiver circuitry may utilize a 1.8V supply voltage. This supply voltage may exceed a supply voltage of a destination voltage domain (e.g., about ~1V), and the receiver circuitry may generate an output signal that is down-converted to the supply voltage range of the destination voltage domain.

The above technique may work provided that voltage of the input signal does not vary in a range that exceeds a supply voltage of the receiver circuitry, e.g., when the input signal does not vary in a range greater than 0V-1.8V. However, in some systems, the receiver circuitry should be able to handle input signals from a 2.5V or 3.3V source voltage domain. However, wherever the source voltage domain operates from a supply voltage that exceeds the native voltage of the components within the receiver circuitry, this may give rise to reliability problems due to components within the receiver circuitry potentially being exposed to a voltage overstress during the course of operation.

In some scenarios, it may be useful for the same receiver circuitry to operate with input signals having various different ranges of voltage swing, e.g., 0V-1.8V, 0V-2.5V, and/or 0V-3.3V. For instance, the source voltage domain may be able to switch between multiple different supply voltages (e.g., in different operating modes), and therefore, the receiver circuitry may be able to operate correctly irrespective of the current source supply voltage used by the source voltage domain.

Further, in situations where the receiver circuitry operates from a supply voltage matching the native voltage of its components, other problems may arise when attempting to reliably detect logic low to logic high and logic high to logic low transitions in the input signal across the various different voltage ranges of the input signal. For instance, if a minimum input voltage that may cause detection of a logic high state of the input signal is referred to as VIH, and a maximum input voltage that may cause detection of a logic low state of the input signal is referred to as VIL, a situation may arise where there is insufficient margin to reliably detect the logic high and logic low states.

For instance, when an input of the receiver circuitry is coupled to a 3.3V driver, JEDEC TTL levels may indicate that, if the receiver circuitry uses a 1.8V supply voltage, then its corresponding VIH and VIL values may be 2V and 0.8V, respectively. Thus, such receiver circuitry may be sized to have its trip point for detecting a logic low level set higher than 0.8V, and its trip point for detecting a logic high level set lower than 2V. If the same receiver circuitry were then used to detect an input signal using a 1.8V supply voltage, then its VIH and VIL values may be 1.155V and 0.585V, respectively. As such, the trip points may be set with respect to the lowest VIH and highest VIL, and there may be a margin of 0.355V between the lowest VIH and highest VIL values.

In this instance, it may be difficult to maintain reliable trip points with this small margin. Moreover, if effects such as noise are introduced, then this may further reduce the margin, thus potentially causing incorrect operation and reduced reliability.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

FIG. 8 illustrates a table of the VIH and VIL levels achieved when employing the receiver circuitry of FIG. 4 in accordance with various implementations described herein.

DETAILED DESCRIPTION

Various implementations of receiver circuitry may be described in detail herein with reference to FIGS. 1-14.

Figure 1:
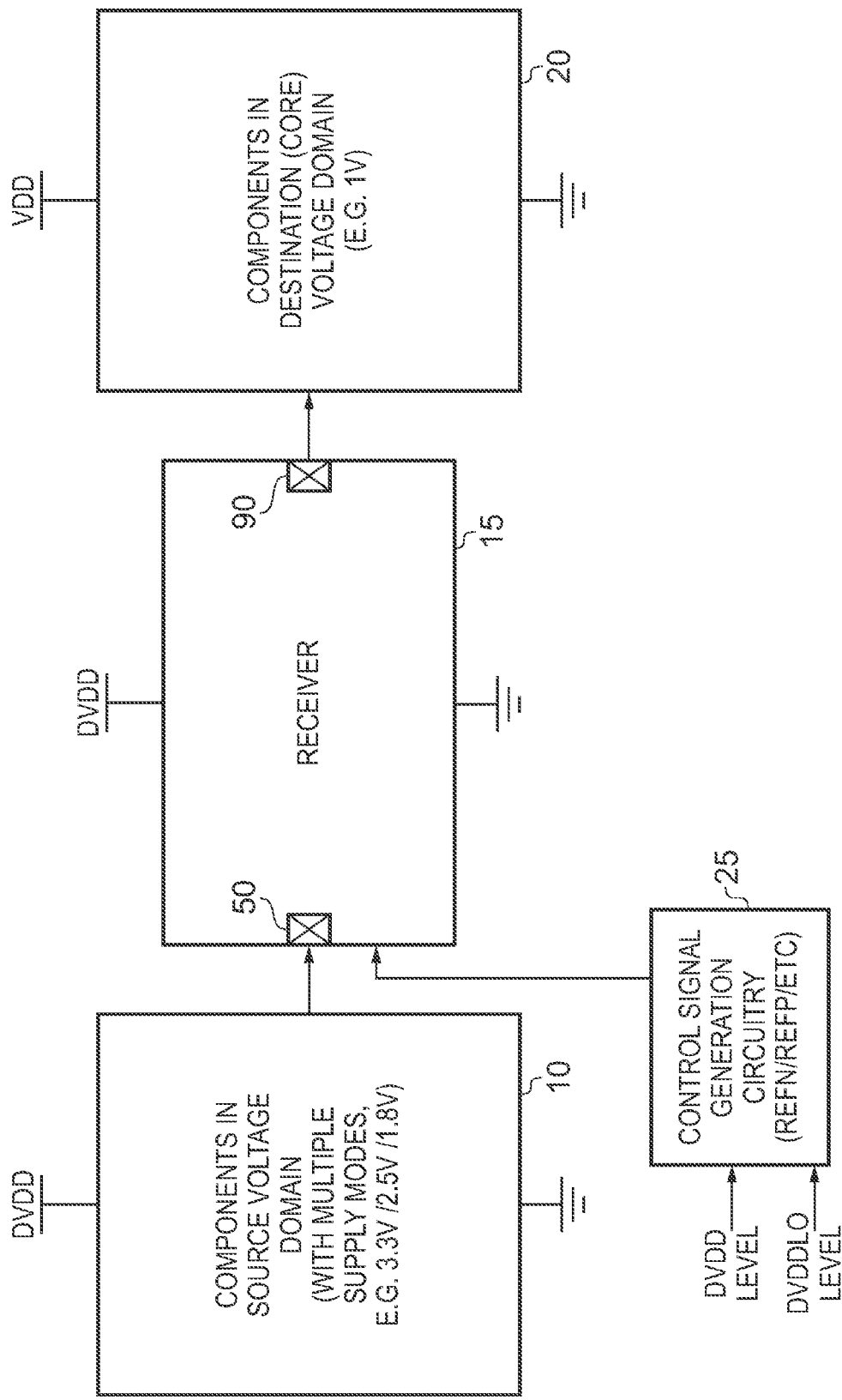
FIG. 1 illustrates a block diagram of a data processing system having receiver circuitry in accordance with various implementations described herein.

FIG. 1 illustrates a block diagram of a data processing system having receiver circuitry 15 in accordance with various implementations described herein.

As shown in FIG. 1, a source voltage domain 10 may include a number of various components operating from a source supply voltage DVDD of the source voltage domain 10. Further, a reference voltage provided to the source voltage domain 10 may include a ground connection (VSS, GND), and signals generated by components in the source voltage domain 10 may vary in a voltage range between DVDD and 0V.

In some implementations, a signal generated in the source voltage domain 10 may be propagated to one or more components in a destination voltage domain 20, which may be referred to as a core voltage domain. Further, the core voltage domain 20 may operate from a core supply voltage VDD, and the core voltage domain 20 may receive as its reference voltage a ground connection (VSS, GND), so that signals in the destination voltage domain 20 vary in the range between VDD and 0V.

As shown in FIG. 1, receiver circuitry 15 may receive at an input connection 50, which may be referred to as an input PAD, a signal generated from the source voltage domain 10 that may be propagated to the destination voltage domain 20. The receiver circuitry 15 may convert the propagated signal from a voltage range of the source voltage domain 10 to another corresponding signal within another voltage range of the destination voltage domain 20. Further, the receiver circuitry 15 may output the converted signal from the output connection 90, which may be referred to as an output Rxout.

In some implementations, the receiver circuitry 15 may be fabricated with one or more components having a stressing threshold, which may correspond to a native voltage of, e.g., 1.8V. The components may include complementary metal-oxide-semiconductor (CMOS) devices. In some instances, the source voltage domain 10 may operate from a voltage exceeding the native voltage of the components within the receiver circuitry 15. In some other instances, the source voltage domain 10 may permanently operate from a voltage greater than the native voltage. In still other instances, as shown in FIG. 1, the source voltage domain 10 may have a number of different operating modes, with each having an associated supply voltage, where in at least one operating mode, the supply voltage may exceed the native voltage of the receiver components.

As shown in FIG. 1, the receiver circuitry 15 may be arranged to operate from a same supply voltage as currently being used by the source voltage domain 10, such as the source supply voltage DVDD. In some cases, the receiver circuitry 15 may operate from the source supply voltage DVDD in situations where the supply voltage exceeds the native voltage of the components within the receiver circuitry 15. Using the source supply voltage DVDD of the source voltage domain 10 may enable the receiver circuitry 15 to maintain a suitable margin between high and low threshold voltages VIH, VIL to thereby ensure reliable detection of transitions in the input signal between logic low and logic high levels in either direction. However, to avoid overstress of components within the receiver circuitry 15, a number of measures may be adopted within the receiver circuitry 15 to ensure that the individual components within the receiver circuitry 15 are not exposed to voltages greater than their native voltage.

To enable these measures, the receiver circuitry 15 may be arranged to receive a number of control signals REFN, REFP from control signal generation circuitry 25. The control signals REFN, REFP may be generated based on a current level of the source supply voltage DVDD used by the source voltage domain 10 and a specified DVDDLO value, such as, e.g., 1.8V. As shown in FIG. 1, the control signal generation circuitry 25 may generate multiple reference voltage levels, such as REFN, REFP. In some cases, REFN refers to an n-type MOS (NMOS) reference voltage that may be set to the native voltage of the components within the receiver circuitry 15, such as, e.g., to 1.8V. Further, REFP refers to a p-type MOS (PMOS) reference voltage that may be set to a level, such as, e.g., DVDD−REFN. Thus, a value of REFP may vary depending on the source supply voltage DVDD used by the source voltage domain 10. Further, in some cases, the control signal generation circuitry 25 may also generate a number of other signals used by the receiver circuitry 15 to control the generation of the output signal from the output Rxout 90 in response to the input signal received at the input pad 50.

Figure 2:
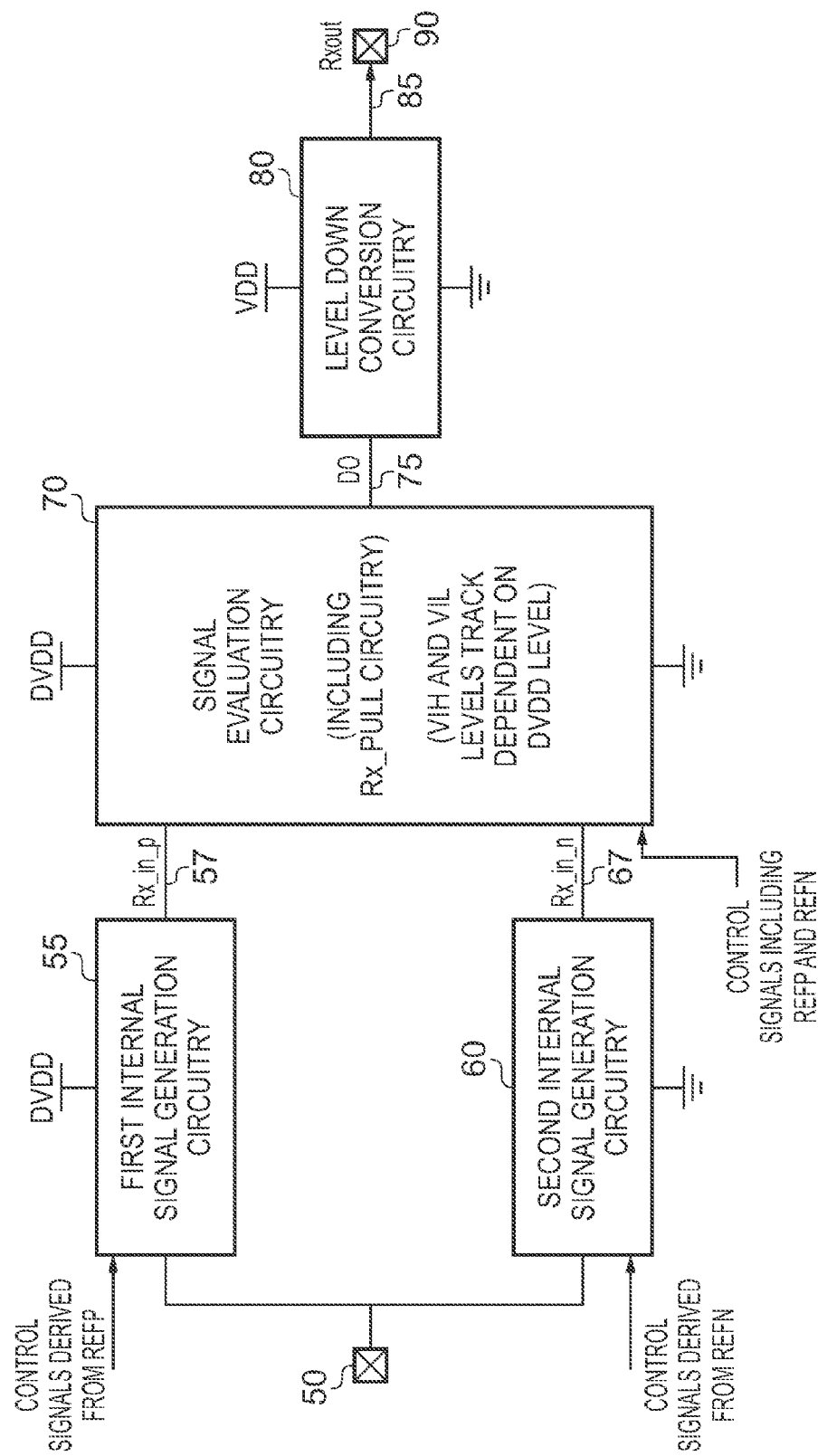
FIG. 2 illustrates a block diagram of components provided within the receiver circuitry of FIG. 1 in accordance with various implementations described herein.

FIG. 2 illustrates a block diagram of components provided within the receiver circuitry 15 of FIG. 1 in accordance with various implementations described herein.

As shown in FIG. 2, multiple different internal signal generation circuits 55, 60 may be provided, including a first internal signal generation circuitry 55 and a second internal signal generation circuitry 60. In some cases, the first internal signal generation circuitry 55 may receive as its supply voltage the DVDD voltage, and has its reference voltage set to the value REFP by virtue of various control signals being received by the first internal signal generation circuitry 55 that are derived from REFP. The first internal signal generation circuitry 55 may receive the input signal from the input PAD 50 and then convert the input signal to a first internal signal Rx_in_p that is output over path 57. The first internal signal Rx_in_p may vary between the voltage level DVDD and a lower voltage level equal to REFP+VTP (e.g., where VTP is the threshold voltage of a PMOS transistor), dependent on the value of the input signal received at the input pad 50.

The second internal signal generation circuitry 60 may operate from an effective supply voltage of REFN and may be coupled to ground (VSS, GND). The second internal signal generation circuitry 60 may generate a second internal signal Rx_in_n output over path 67, and that signal varies between a voltage level of REFN-VTN (e.g., where VTN is a threshold voltage of an NMOS transistor) and 0V. The second internal signal generation circuitry 60 may receive control signals derived from the REFN voltage level to generate the second internal signal Rx_in_n within the above-mentioned voltage range.

As a result of operation of the first and second internal signal generation circuits 55, 60, the multiple internal signals generated over paths 57, 67 vary in a voltage range that may not exceed the native voltage range of the components within signal evaluation circuitry 70. Thus, in some cases, these signals may be used directly as an input to one or more transistors within the signal evaluation circuitry 70 without the risk of potentially damaging those components due to exceeding the gate-source or gate-drain maximum voltage drops that those components are designed to accommodate.

As shown, the signal evaluation circuitry 70 operates between the DVDD supply voltage and ground, and generates an intermediate signal DO output over path 75, which may vary between the DVDD voltage level and 0V. Since the signal evaluation circuitry operates from the same supply voltage as used by the source voltage domain 10, it establishes VIH and VIL levels that track dependent on the supply voltage of the source voltage domain 10, hence enabling a sufficient margin to be retained for reliable detection of logic low to logic high transitions and logic high to logic low transitions in the input signal, irrespective of the supply voltage used by the source voltage domain 10.

As may be discussed later, to avoid overstress of any of the components within the signal evaluation circuitry due to a voltage drop across those components exceeding the native voltage (e.g., a voltage drop between the drain and source of transistors used within the signal evaluation circuitry), a number of tracking circuits are included within the signal evaluation circuitry that monitor the input voltage to those components and ensure that, irrespective of the input voltage, the voltage drop across the components does not exceed the native voltage.

In addition, as may be discussed in more detail later, the operation of the first and second internal signal generation circuits results in there being a period of time, referred to herein as a dead zone period, where neither of the internal signals Rx_in_p and Rx_in_n are changing whilst the input signal's voltage is changing. This may potentially cause an unwanted delay in the detection of a logic low to logic high transition in the input signal, and as may be discussed later with reference to FIG. 4 this delay is alleviated through the use of an assist circuit, also referred to herein as an Rx_Pull circuit.

As shown in FIG. 2, the intermediate signal generated over path 75 is down converted to the voltage range of the destination voltage domain using the level down conversion circuitry 80, which receives the core supply voltage VDD of the destination voltage domain. This ensures that the output signal passed over path 85 to the output Rxout 90 varies in the voltage range between VDD and ground, as used by the components in the destination voltage domain.

Figure 3A:
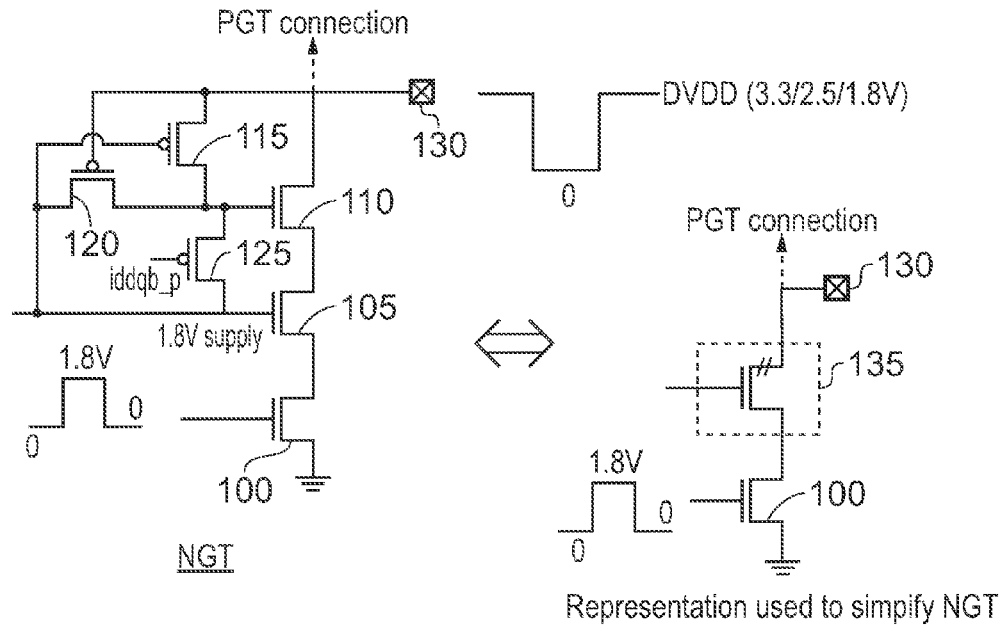
FIGS. 3A-3B illustrate gate tracking circuitry used in association with NMOS and PMOS devices in accordance with various implementations described herein.
Figure 3B:
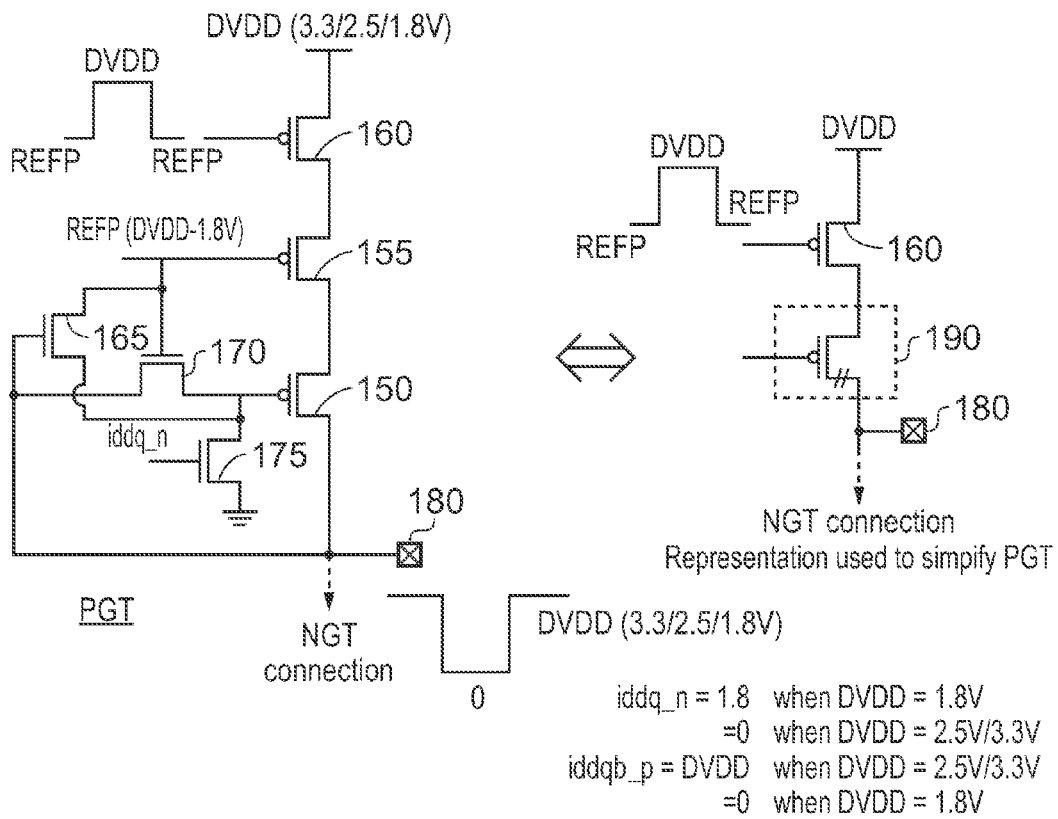

FIGS. 3A-3B illustrate gate tracking circuits used in association with NMOS and PMOS devices in accordance with various implementations described herein.

Prior to discussing construction of the receiver circuitry 15, the tracking circuits may be discussed with reference to FIGS. 3A-3B. For instance, the tracking circuits may include gate tracking circuits used in association with NMOS and PMOS transistors, and function of these gate tracking circuits may ensure that, irrespective of voltage logic level (0 or 1) applied to the gate of those NMOS or PMOS transistors, the voltage drop between the drain and source of those transistors does not exceed the native voltage, in this instance, it being assumed that the native voltage is 1.8V. Considering FIG. 3A, an NMOS transistor 100 may be provided for which the gate tracking functionality is used, and this NMOS transistor 100 may receive an input signal that may vary between 0 and 1.8V. However, it is coupled to a connection 130 whose voltage may vary between DVDD and 0V. Accordingly, a gate tracking circuit (denoted schematically by element 135 in the right hand side of FIG. 3A) is used to ensure that, irrespective of the voltage level at the connection 130, the voltage drop between the drain and source of the transistor 100 may not exceed the native voltage of that transistor, in this instance 1.8V.

As shown in the left hand side of FIG. 3A, the gate tracking circuit 135 (also referred to herein as the NGT circuit) actually comprises of a pair of NMOS transistors 105, 110 placed in series with the NMOS transistor 100 to form a transistor stack between the connection point 130 and the ground connection. In addition, a number of further transistors 115, 120, 125 are used to control the operation of the transistor 110 dependent on the voltage level at the connection 130.

When the input signal at the gate of the transistor 100 transitions to the logic high level (1.8V in this case), this turns on the transistor 100, and causes the connection point 130 to discharge to a logic zero level through the other transistors 105, 110. When the input signal to the gate of the transistor 100 returns to a logic zero level, other components within the system may cause the voltage at the connection point 130 to rise back to the DVDD voltage level. In one particular embodiment, it is often the case that the NGT circuit of FIG. 3A is coupled to the PGT circuit of FIG. 3B, and it is the operation of the PGT circuit that causes the connection 130 to transition back to the DVDD level in these circumstances.

When the DVDD voltage level is 1.8V, the control signal iddqb_p is set equal to zero, turning on the transistor 125, and causing the gates of both of the transistors 105, 110 to be turned on. This effectively bypasses the protection functionality of the NGT circuit, since when the DVDD level is 1.8V, there is no risk of overstressing the NMOS component 100. However, when the DVDD level is higher, for instance 2.5V or 3.3V, the control signal iddqb_p is set to the DVDD level, turning off the transistor 125. In this instance, the voltage provided to the gate of the transistor 110 is then dependent on the operation of the transistors 115, 120. For instance, it may be appreciated that if the connection point 130 is at 3.3 or 2.5V this may cause the transistor 115 to turn on and the transistor 120 to turn off. Conversely, if the connection point 130 is at a zero volt level, this may cause the transistor 120 to turn on and the transistor 115 to turn off. This may hence control the voltage drop across the individual transistors 100, 105, 110 in the transistor stack to ensure that no one transistor is exposed to a voltage drop that exceeds the native voltage of those transistors, irrespective of whether the connection point 130 is at the DVDD voltage level or the 0V level.

FIG. 3B shows gate tracking circuitry 190 for the PMOS transistor 160. In this instance, the input signal to the PMOS transistor 160 varies between the REFP level and the DVDD level. The PGT gate tracking device 190 comprises of an additional two PMOS transistors 150, 155 placed in series with the PMOS transistor 160 to form a transistor stack between the DVDD level and the connection point 180. In some cases, transistors 165, 170 and 175 provide control functionality for the input to the gates of the transistor 150. When the DVDD voltage is set to 1.8V, the iddq_n signal is set to 1.8V, turning on the transistor 175 and providing a logic zero input to the gate of the PMOS transistor 150, turning that transistor on. In that instance, REFP may also be at a logic zero level, turning on the PMOS transistor 155, and the protection functionality of the PGT device may be bypassed in that situation, as it is not used.

Otherwise, the transistor 175 may be turned off, and the gate voltages provided to the PMOS transistor 150 may depend on the operation of the PMOS transistors 165, 170. The NMOS transistors 165, 170 operate in essentially the same way as described earlier for the control transistors 115, 120 of the NGT device, with one of the NMOS transistors 165, 170 being turned on while the other is turned off, thus ensuring that at any point in time the voltage drop across any of the PMOS transistors 150, 155, 160 in the transistor stack does not exceed the native voltage of those transistors.

In some implementations, the gate tracking circuits described in reference to FIGS. 3A-3B may be similar to those described in an article entitled, "5.5-V I/O in a 2.5-V 0.25-um CMOS Technology," by Annema et. al., IEEE Journal of Solid State Circuits, 2001, which describes in general terms using gate tracking technology in association with transistors to improve lifetime of those components.

Figure 4:
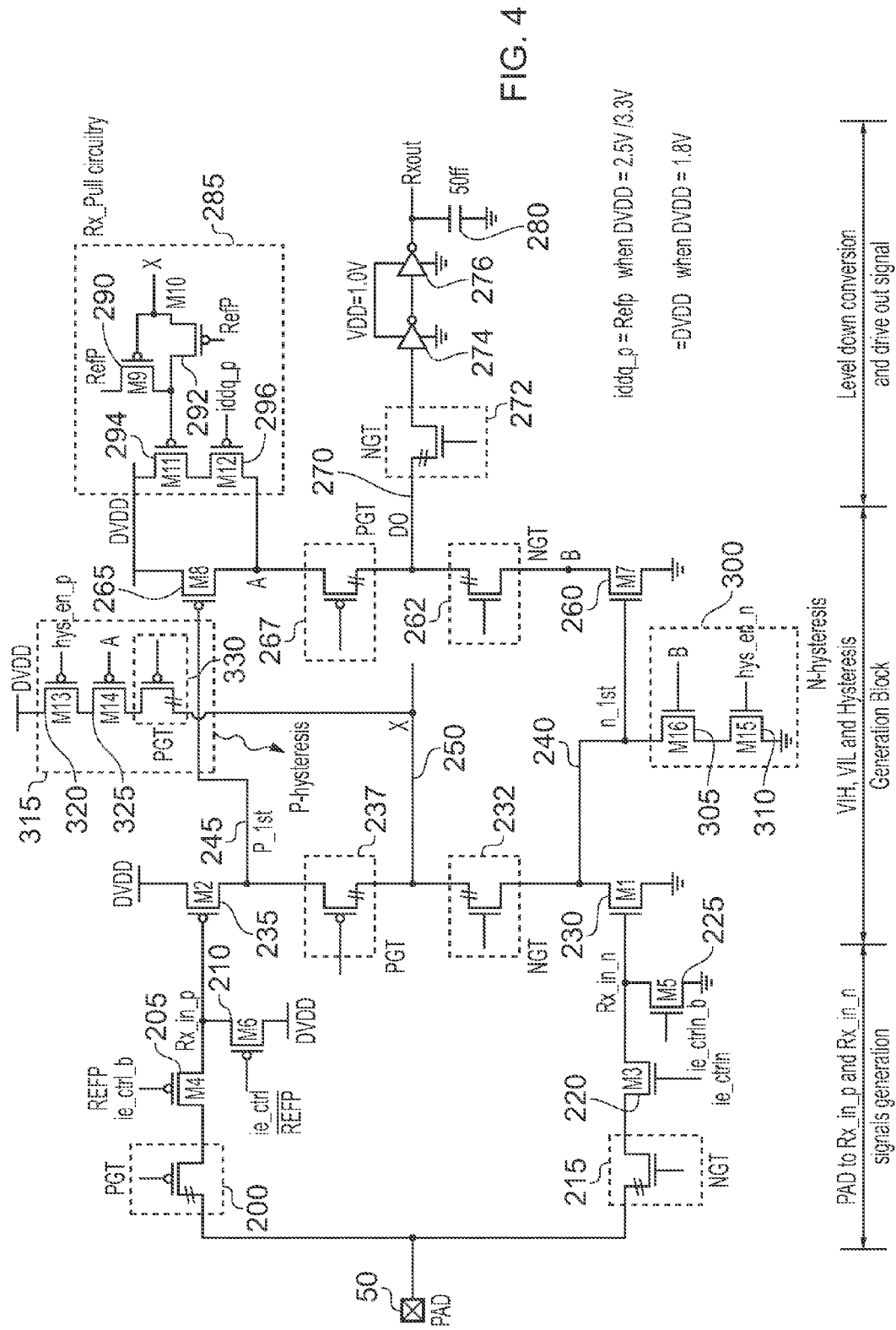
FIG. 4 illustrates a schematic diagram of receiver circuitry in accordance with various implementations described herein.

FIG. 4 illustrates a schematic diagram of receiver circuitry 15 in accordance with various implementations described herein.

The first internal signal generation circuitry 55 of FIG. 2 is formed by the PGT device 200, PMOS transistor 205 and the PMOS transistor 210. The input to the gate of the PMOS transistor 205 is a control signal ie_ctrl_b which is set equal to REFP. The PMOS transistor 210 then receives the control signal ie_ctrl, which is the inverse of the control signal provided to the transistor 205. These components may operate such that the first internal signal Rx_in_p generated by those components may track with changes in the input signal at the input pad 50 once the value of the input signal reaches a first intermediate voltage. As mentioned herein, this first intermediate voltage may be set equal to REFP+ VTP, where VTP is the threshold voltage of the PMOS transistors. Hence, considering the instance where DVDD is 3.3V, and the threshold voltage of the PMOS transistors is 0.5V, it may be seen that REFP is 1.5V, and accordingly the first intermediate voltage may be 2.0V. Hence, whenever the input voltage exceeds 2V, Rx_in_p may track with the input voltage.

The second internal signal generation circuitry 60 is formed of the NGT device 215, the NMOS transistor 220 and the NMOS transistor 225. In this instance, the control signal ie_ctrln provided at the gate of the NMOS transistor 220 is set equal to REFN, and the control ie_ctrln_b provided to the gate of the transistor 225 is the inverse of the ie_ctrln signal. These components operate to ensure that the second internal signal Rx_in_n may track with changes in the input signal between 0V and the point where the input signal reaches a second intermediate voltage. In some instances, the second intermediate voltage may be REFN- VTN, and where the native voltage is 1.8V, and where the threshold voltage is 0.5V, this may mean that the second intermediate voltage may be 1.3V.

The signal evaluation circuitry essentially is comprised of the transistors 230, 235, 260, 265 and associated NGT and PGT tracking circuits 232, 237, 262, 267. Hence, when the input signal on the pad 50 transitions from the logic low to the logic high level, the transistor 230 may turn on and the transistor 235 may turn off. This in turn may cause the transistor 265 to turn on and the transistor 260 to turn off, hence pulling the intermediate signal D0 on the line 270 to the logic high (DVDD) level. As may be discussed in more detail later, due to a dead zone period where the internal signals Rx_in_n and Rx_in_p are not changing whilst the input signal is changing, the above described operation is actually supplemented by the Rx_Pull circuitry 285, which ensures that the intermediate signal D0 is pulled up to the DVDD level quicker than would be the case merely from relying on the transitions in the signals on the lines 240, 245.

Conversely, when the input signal is transitioning from a logic high state to a logic low state, the transistor 230 may turn off and the transistor 235 may turn on. This may in turn cause the transistor 265 to turn off and the transistor 260 to turn on, pulling the intermediate signal D0 on the line 270 down to the logic zero level.

Hence, it may be seen that in both situations the signal D0 on the line 270 tracks with the input signal, and provides a signal which may then be down converted by the level down conversion circuitry 80 (formed of the NGT device 272 and the buffer circuitry 274, 276) to form the output signal within a voltage range used by the destination voltage domain.

Since the transistors 230, 235 are coupled between the DVDD voltage level and ground, this enables the signal evaluation circuitry to establish VIH and VIL levels but vary dependent on the value of DVDD. The value of the signal on the line 240 is effectively used to evaluate the VIL condition, while the value of the signal on the line 245 is effectively used to evaluate the VIH condition.

The operation of the Rx_Pull circuitry 285 may now be described in more detail. As mentioned earlier, this operates to speed up detection of the logic low to logic high transition of the input signal 50. During such a transition, the transistor 230 may turn on, and may begin to discharge the line 240. This may also begin to discharge the node X on the signal line 250 provided between the NGT 232 and PGT 237 devices. The PMOS transistor 235 may also begin to be turned off, and accordingly over time the signal on the line 245 may transition towards the logic zero level.

However, rather than waiting for the voltage on the signal line 245 to discharge to a sufficient level to turn on the PMOS transistor 265, the Rx_Pull circuitry 285 instead monitors the voltage on the node 250. As soon as this drops to a level sufficient to turn on the transistor 290, this may cause the action of the transistors 290 and 292 to turn on the transistor 294. In situations where the DVDD level is 2.5V or 3.3V, the transistor 296 may also be turned on, and as a result node A may be pulled up to the DVDD level without needing to wait for the transistor 265 to turn on.

However, for certain supply voltages, it is not necessary to use the Rx_Pull circuitry. For instance, when the source supply voltage DVDD is 1.8V, then the iddq_p signal is set to DVDD, thereby turning off the PMOS transistor 296, and disabling the action of the Rx_Pull circuitry 285.

When the intermediate signal D0 on line 270 transitions to the DVDD logic level, the NGT component 272 is used to drop that voltage down to a lower level, before it is input to the buffer circuitry 274, 276, which then performs the remaining down conversion to generate the output signal varying in the voltage range between 1.0V and ground. Conversely, when the intermediate signal D0 is at the 0V level, that signal passes unaltered through the NGT component 272, and is merely output "as is" via the buffer circuitry 274, 276. The capacitance 280 shown in the figure represents the output load.

As mentioned earlier, by operating the receiver circuitry 15 from the source supply voltage DVDD, this enables a good margin to be maintained between the VIH and VIL levels, for various different DVDD supply voltages. However, in some situations certain effects may serve to reduce the effective margin between the VIH and VIL levels. For instance, when noise is introduced into the circuit, this may reduce the effective margin between VIH and VIL, and may in certain situations adversely affect the reliable detection of logic low to logic high and logic high to logic low transitions.

In some implementations, this problem may be alleviated through the provision of hysteresis generation circuits 300, 315. These circuits may be enabled or disabled via setting of hysteresis enable signals. For instance, the hys_en_n signal may be enabled by setting that signal to the REFN level, thereby turning on the transistor 310, or may be disabled by setting that signal to a logic zero value, turning off the transistor 310. Similarly, in some instances, the hys_en_p signal may be set to the REFP level to turn on the PMOS transistor 320, or may be set to the DVDD level, to turn off the transistor 320 when the hysteresis generation circuitry is not used.

As discussed herein, during a logic high to logic low transition of the input signal, the voltage on the signal line 240 may begin to rise, and at some point may turn on the transistor 260. When the hysteresis circuit 300 is enabled, since the starting voltage of the node B may be at a logic high level, the hysteresis circuitry may weakly pull the signal line towards the logic zero level, and hence may resist the rising of the signal on the line 240. This may delay the time at which the transistor 260 is turned on, and thus may delay the discharging of the node B. As such, this may effectively reduce the VIL level.

In a similar manner, the hysteresis generation circuitry 315 may effectively elevate the VIH level. However, since the Rx_Pull circuitry 285 is being used to manage the detection of the logic low to logic high transition in the input signal, and the Rx_Pull circuitry operates from the value of the node X on the line 250, the hysteresis generation circuitry 315 is coupled between the DVDD supply voltage level and node X. When the hysteresis generation circuitry 315 is enabled, it may serve to weakly pull the node X towards the logic high level, and hence may resist the discharging of node X to a certain extent. This may slow down the operation of the Rx_Pull circuitry, and hence may effectively increase the VIH level.

Accordingly, it may be seen that by use of the hysteresis generation circuits 300, 315, the effective margin between VIH and VIL is increased, hence enabling effects due to noise and the like to be more readily accommodated while still ensuring reliable operation of the receiver circuitry 15.

Figure 5:
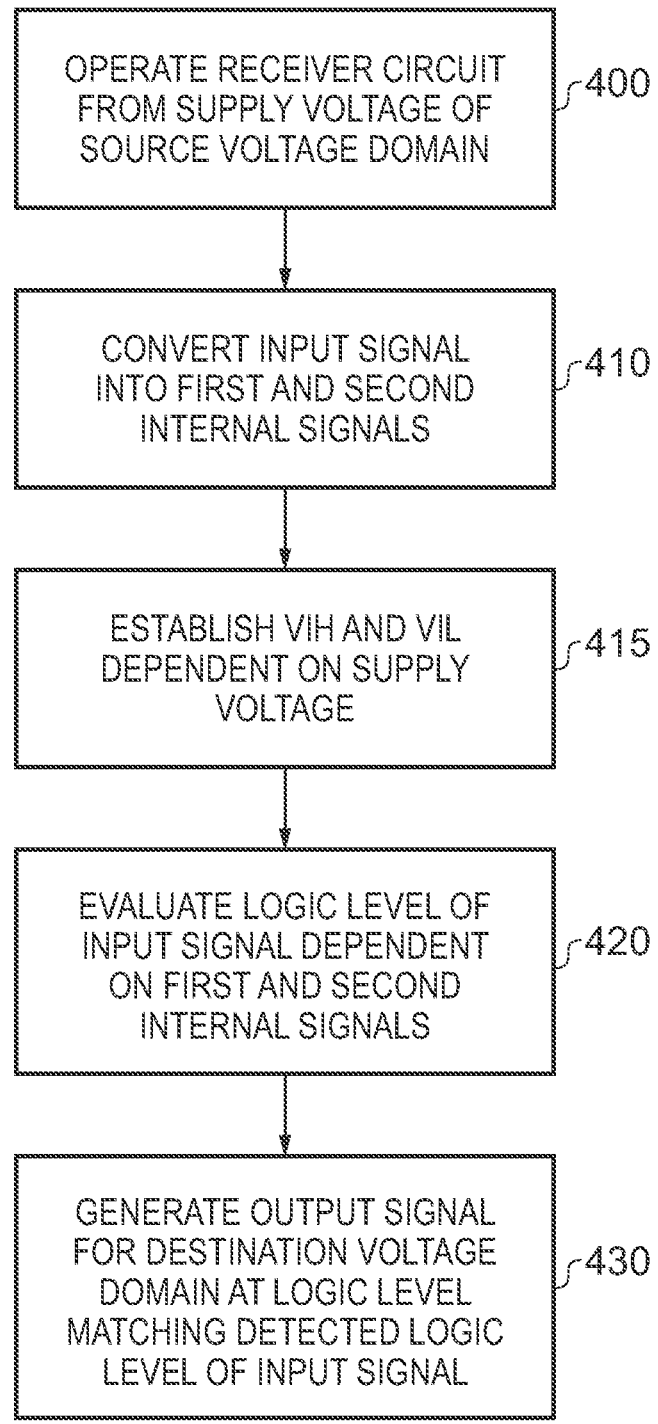
FIG. 5 illustrates a flow diagram of operating receiver circuitry in accordance with various implementations described herein.

FIG. 5 illustrates a process flow diagram of operating receiver circuitry 15 in accordance with various implementations described herein.

At block 400, the receiver circuitry 15 is operated from the supply voltage of the source voltage domain 10. Hence, if the supply voltage of the source voltage domain 10 changes, then so may the supply voltage from which the receiver circuitry 15 is operated, ensuring that VIH and VIL track with the supply voltage of the source voltage domain 10.

At block 410, the input signal is converted into first and second internal signals by the internal signal generation circuits 55, 60.

At block 415, VIH and VIL levels are established by the operation of the signal evaluation circuitry 70, and as mentioned earlier these VIH and VIL levels may be dependent on the supply voltage. At block 420, the VIH, VIL and first and second internal signals are used to evaluate the logic level of the input signal, based on the operation of the receiver circuitry 15 described earlier. Thereafter, at block 430, an output signal is generated for the destination voltage domain at a logic level matching the detected logic level of the input signal.

Figure 6:
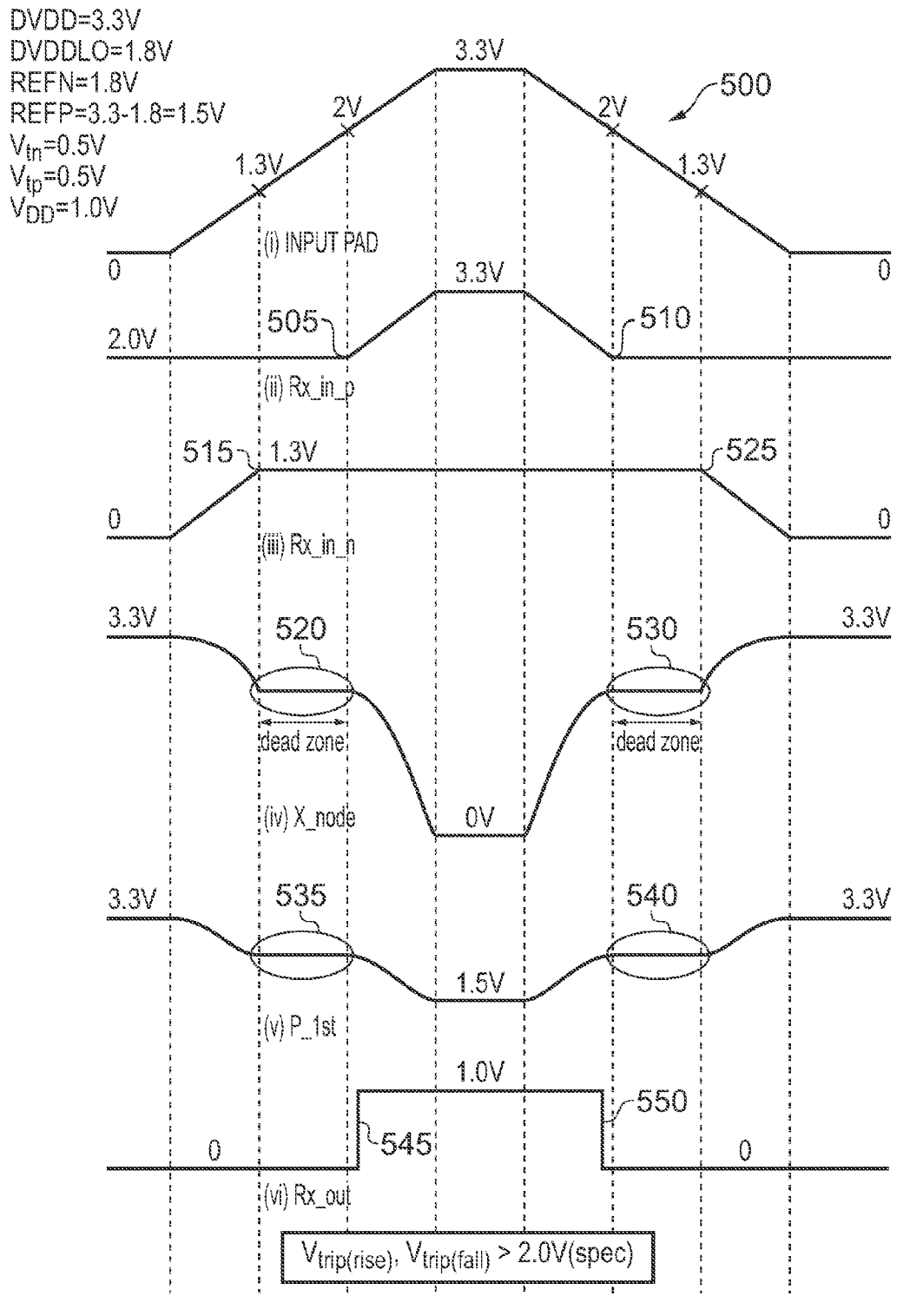
FIG. 6 illustrates a timing diagram of the output signal varying with an input signal in absence of assist circuitry (i.e., Rx_Pull circuitry) shown in FIG. 4 in accordance with various implementations described herein.

FIG. 6 illustrates a timing diagram of the output signal varying with the input signal in absence of assist circuitry (i.e., Rx_Pull circuitry) shown in FIG. 4 in accordance with various implementations described herein.

In some implementations, the Rx_Pull circuitry 285 may not be used, and thus, the dropping of the voltage on the signal line 245 is used to pull up the voltage level at node A during a logic low to logic high transition of the input signal. In this instance, it is assumed that DVDD is 3.3V. As may be seen, the first internal signal Rx_in_p tracks with the input voltage once the input voltage exceeds 2V (i.e. REFP+VTP). Conversely, the second internal signal Rx_in_n tracks with the input signal until the input signal reaches 1.3V (i.e. REFN-VTN). While the input signal is rising, this results in the dead zone 520 being observed in discharging of voltage on the intermediate node X. The corresponding discharge of the signal on the P_1st line 245 is also shown, and again the dead zone effect 535 is shown. Since in this instance the Rx_Pull circuitry is not used, the transistor 265 is instead used to detect the logic high state, and the voltage on the signal line 245 may only drop to a level sufficient for the transistor 265 to turn on after the dead zone period has lapsed, as indicated by the transition 545 in the output signal.

When the signal transitions in the other direction from the logic high to the logic low state, the dead zone effect is also observed as shown by the reference numerals 530, 540 in FIG. 6. However, here it is assumed that the voltage level on the signal line 240 rises sufficiently to turn on the transistor 260, and discharge the node B, prior to the dead zone period arising, and accordingly the transition from the logic high to the logic low state causes the output signal to transition back to the logic zero state at the point 550.

Figure 7:
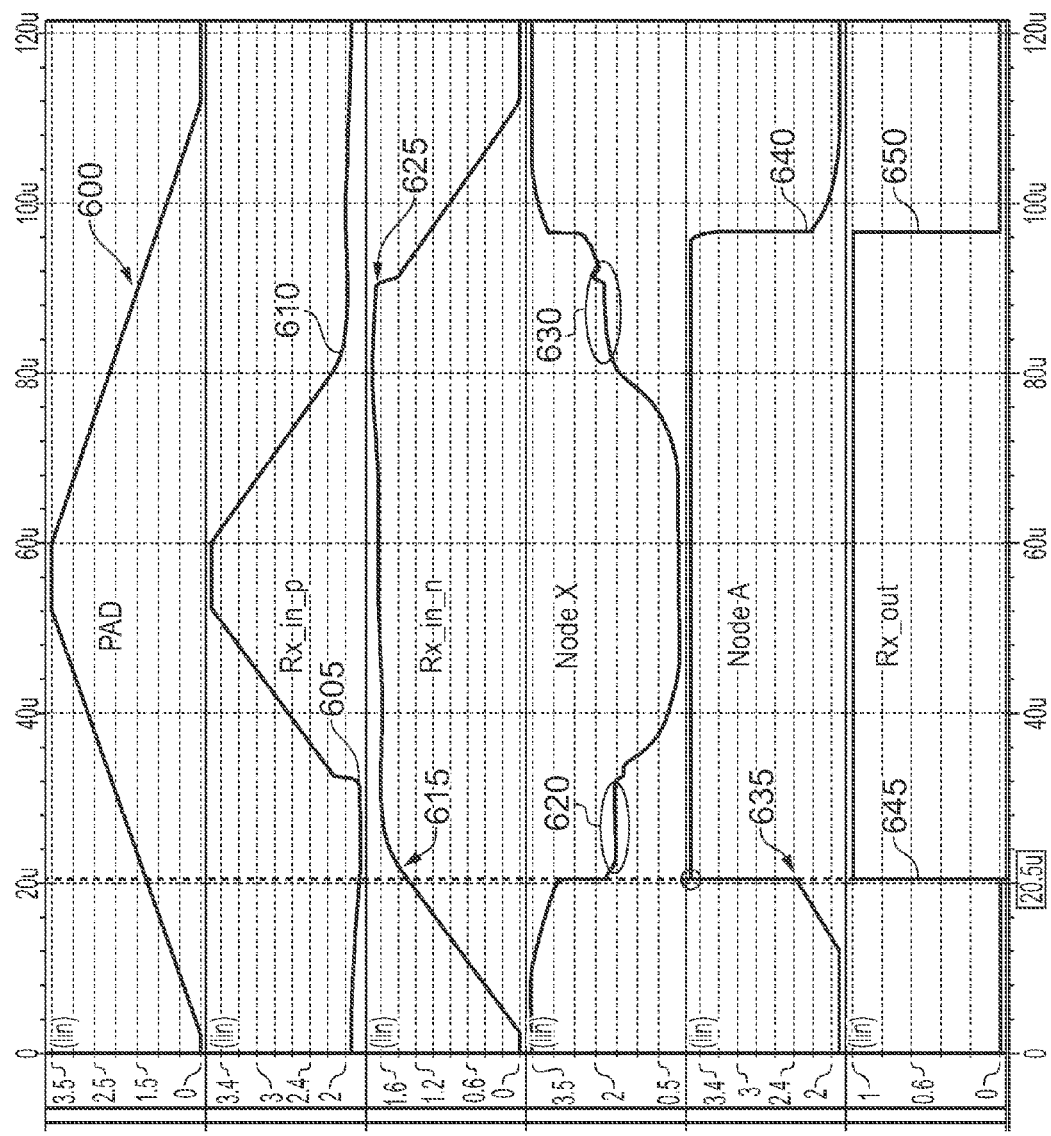
FIG. 7 illustrates a timing diagram of the output signal varying with an input signal when using the assist circuitry shown in FIG. 4 in accordance with various implementations described herein.

FIG. 7 illustrates a timing diagram of the output signal varying with the input signal when using the assist circuitry 285 as shown in FIG. 4 in accordance with various implementations described herein.

In some implementations, points 605, 610, 615, 625 may correspond generally with the points 505, 510, 515 and 525 shown in FIG. 6. In the instance of FIG. 7, the threshold voltage of the NMOS devices is somewhat less than the 0.5V assumed in FIG. 6 (for instance being nearer 0.4V) and this combined with leakage effects results in the Rx-in-n signal transitioning to approximately 1.6V rather than 1.3V.

The dead zones 620, 630 are also shown in respect of node X. However, since the Rx_Pull circuitry may have detected the drop in node X prior to the dead zone, and that drop may have been sufficient to turn on the Rx_Pull circuitry, this causes the voltage at node A to transition high at the point 635, hence causing the output signal to transition high at the point 645.

With regard to the logic high to logic zero transition, node A transitions to the logic low level at point 640 after the dead zone period 630, and this causes a corresponding transition from the logic high to a logic low state at point 650 in the output signal. It should be noted that this transition occurs later in FIG. 7 than in FIG. 6, due to the presence of the Rx_pull circuitry 285 (and in particular the transistor 294) delaying the pull down action of the NMOS transistor 260.

As may be seen from a comparison of FIGS. 6-7, through use of the circuitry of FIG. 4, this results in a quicker detection of the logic zero to logic high transition, and hence a longer period during which the output signal is at the logic high state.

FIG. 8 illustrates a table of the VIH and VIL levels achieved when employing the receiver circuitry of FIG. 4 in accordance with various implementations described herein. The table shows the VIH and VIL levels established using the circuitry of FIG. 4 for the three different instance supply voltages of 3.3V, 2.5V and 1.8V, and in situations where both the hysteresis generation circuitry is turned on and where it is turned off. In some cases, the VIH levels are set lower than those used by the JEDEC TTL specification, and similarly the VIL levels are set higher than those used by the JEDEC TTL levels, hence allowing those specifications to be met. Similarly, when the hysteresis generation circuitry is used, the hysteresis generation circuitry generates a level of hysteresis greater than that used by the specification.

In the above described embodiments, it may be seen that such embodiments provide a receiver circuitry 15 which may maintain sufficient margin between VIH and VIL levels when coupled to a source voltage domain 10 operating from a variety of different supply voltages, including at least one supply voltage that exceeds the native voltage of the components within the receiver. The receiver circuitry 15 is operated from the same supply voltage as used by the source voltage domain 10, enabling the VIH and VIL levels to track with changes in the supply voltage of the source voltage domain 10. Further, components are provided within the receiver circuitry 15 to ensure that the components within the receiver are not subjected to overstress conditions which could reduce the lifetime or reliability of the receiver circuitry 15. Rx_Pull circuitry is used to speed up the operation of the receiver circuitry 15, and in addition hysteresis generation circuitry may optionally be utilized to selectively increase the margin between the VIH and VIL levels when used, for instance to accommodate noisy environments.

Figure 9A:
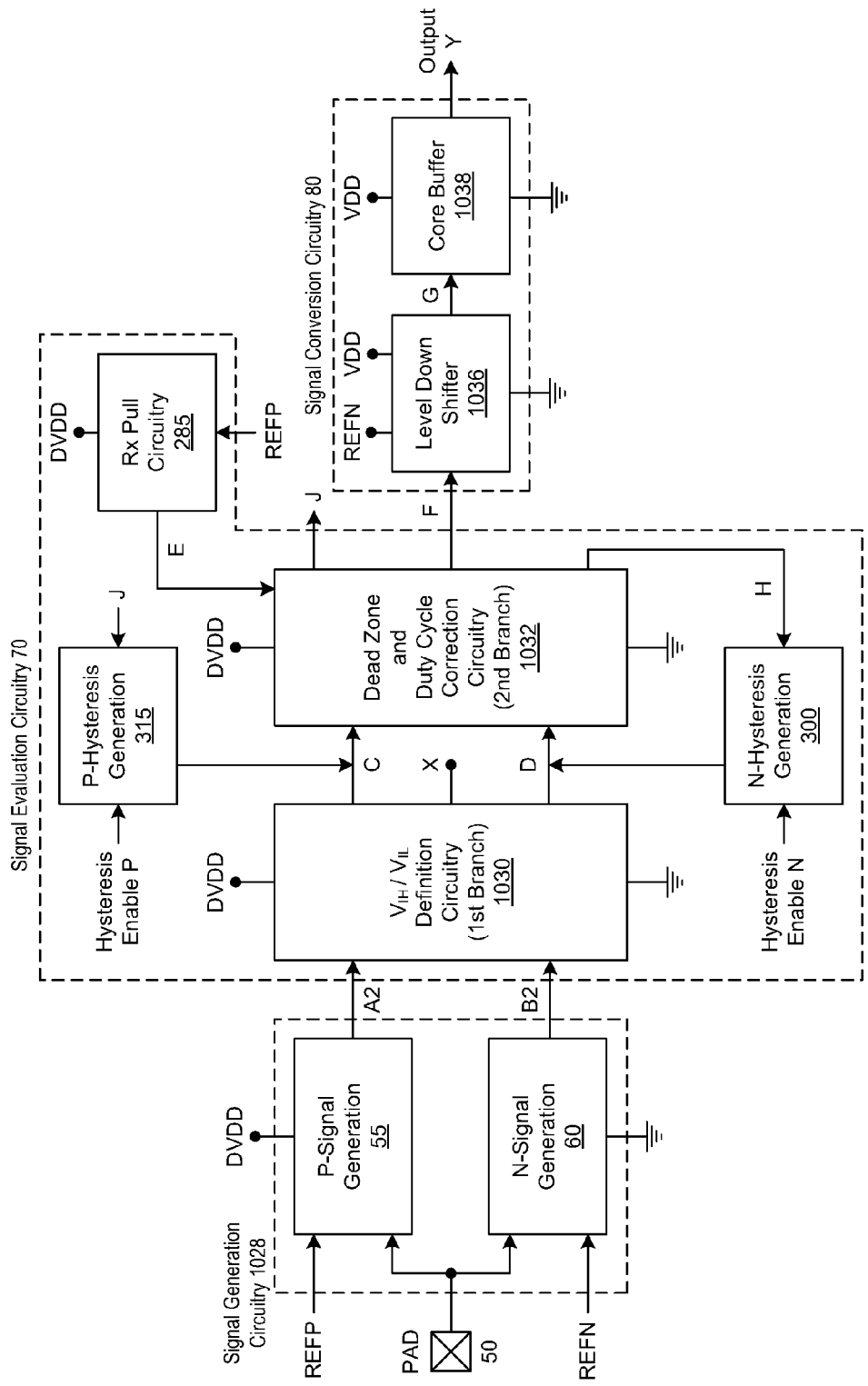
FIGS. 9A-9C illustrate various diagrams related to receiver circuitry of FIGS. 1-8 in accordance with various implementations described herein.
Figure 9B:
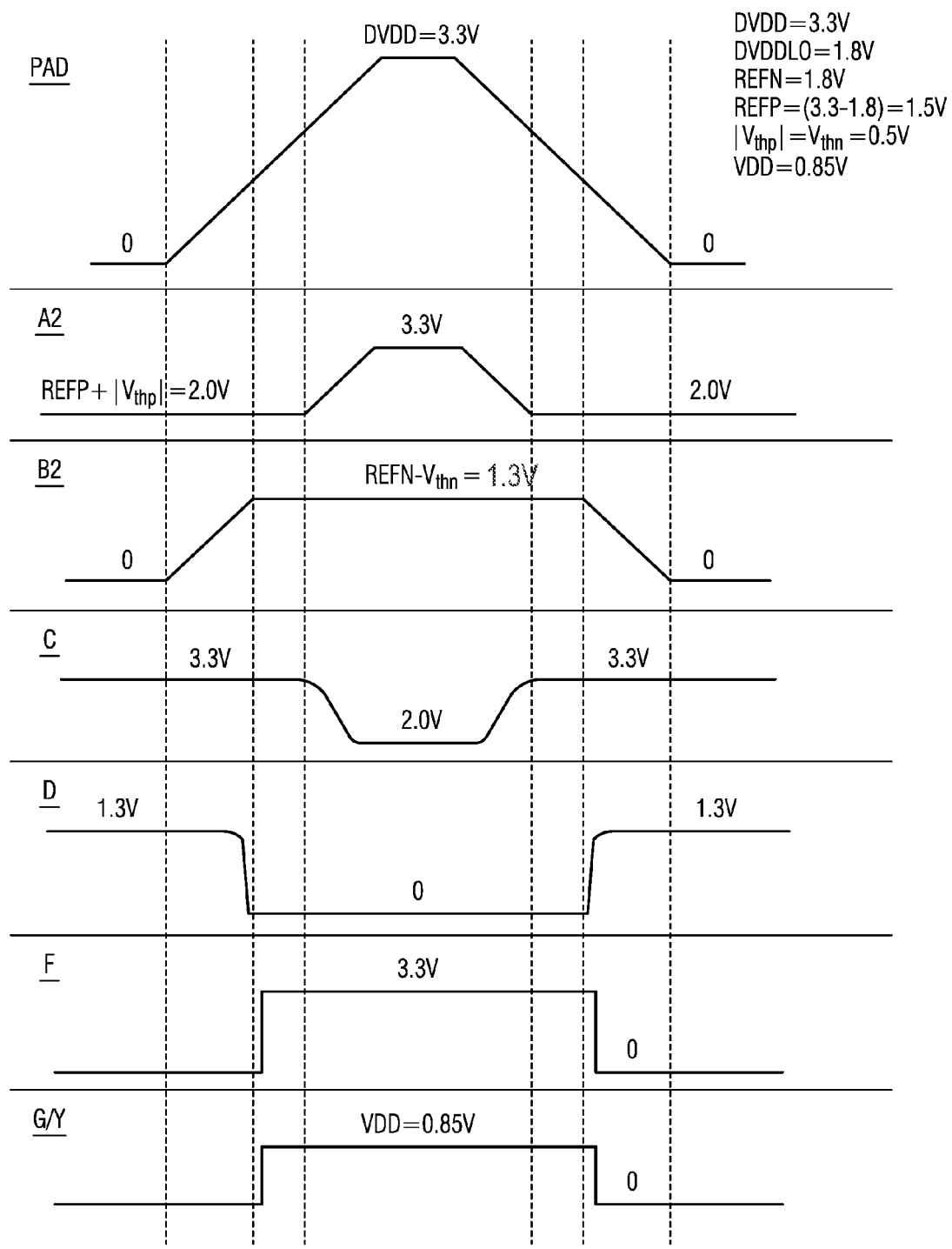
Figure 9C:
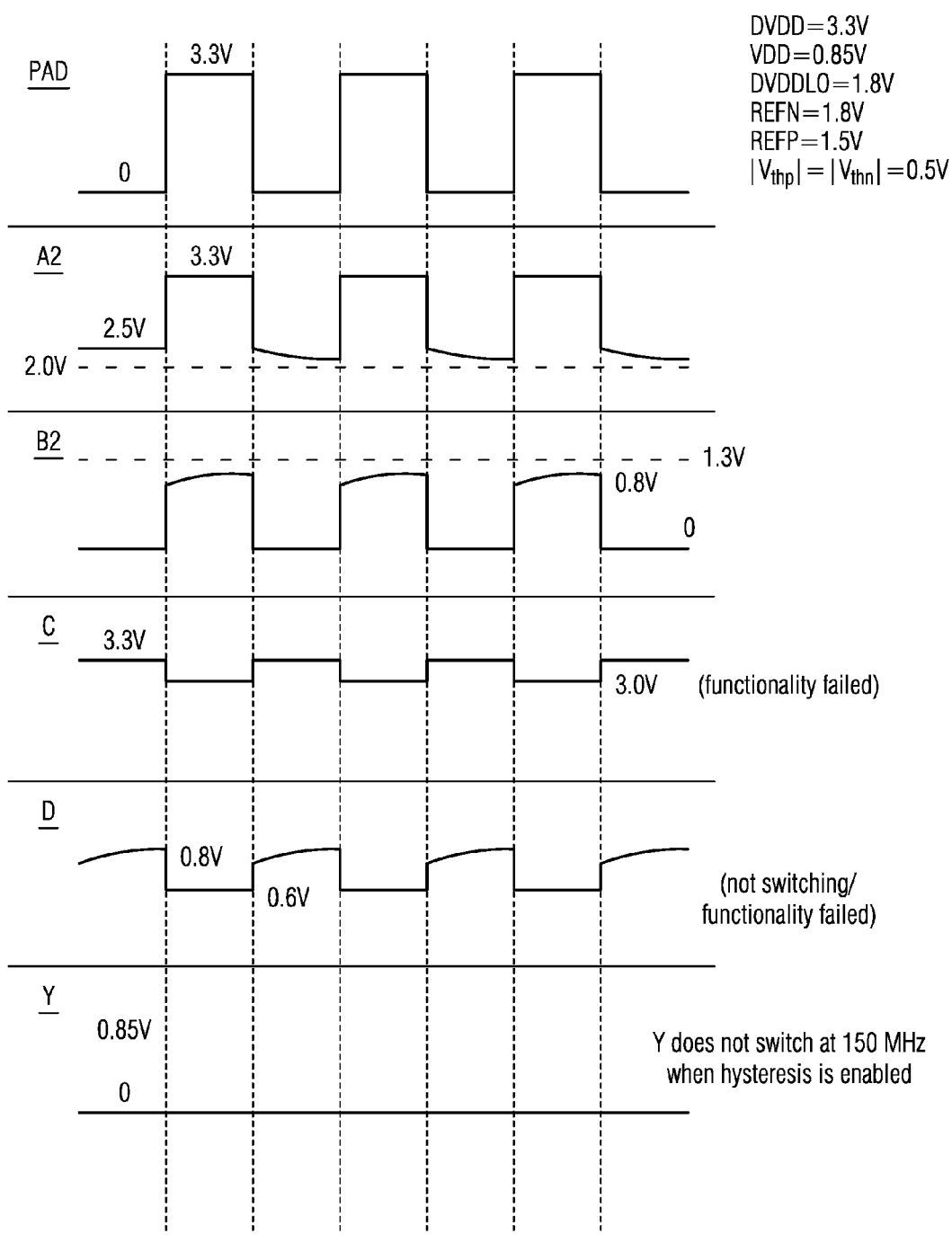

FIGS. 9A-9C illustrate various diagrams related to the receiver circuitry 15 of FIGS. 1-8 in accordance with various implementations described herein.

In particular, FIG. 9A illustrates a more detailed diagram 900A of the receiver circuitry 15 of FIG. 2, FIG. 9B illustrates various signal timing diagrams 900B related to DC operation of the receiver circuitry 15, and FIG. 9C illustrates various signal timing diagrams 900C related to AC operation of the receiver circuitry 15.

As shown in FIG. 9A, the receiver circuitry 15 may include signal generation circuitry 1028 that receives an input signal at input PAD 50 from a first voltage domain (e.g., DVDD) and generates multiple internal signals (A2: Rx_in_p, B2: Rx_in_n) based on the input signal. The signal generation circuitry 1028 may include p-signal generation circuitry 55 that receives the input signal from the input PAD 50 and a p-reference signal REFP, generates the first internal signal A2 based on the input signal and the p-reference signal REFP, and provides the first internal signal A2 to signal evaluation circuitry 70. The signal generation circuitry 1028 may include n-signal generation circuitry 60 that receives the input signal from the input PAD 50 and an n-reference signal REFN, generates the second internal signal B2 based on the input signal and the n-reference signal REFN, and provides the second internal signal B2 to the signal evaluation circuitry 70. As shown in FIG. 1, the receiver circuitry 15 may include control signal generation circuitry 25 that may be used to generate the multiple reference signals, including the p-reference signal REFP and the n-reference signal REFN.

Further, the receiver circuitry 15 may include the signal evaluation circuitry 70 that receives the multiple internal signals A2, B2 from the signal generation circuitry 1028 and provides an intermediate signal (F: D0: 75) based on the multiple internal signals A2, B2. The signal evaluation circuitry 70 may include VIH/VIL definition circuitry 1030 as a first branch that may include the transistors 230, 235 and associated NGT and PGT tracking circuits 232, 237. The signal evaluation circuitry 70 may include dead zone and duty cycle correction circuitry 1032 as a second branch that may include the transistors 260, 265 and associated NGT and PGT tracking circuits 262, 267. The signal evaluation circuitry 70 may be used to establish the logic high voltage threshold VIH and the logic low voltage threshold VIL based on the input signal. Further, the signal evaluation circuitry 70 may be used to employ the multiple internal signals A2, B2 to detect when the input signal transitions between a logic low level (logic 0) and a logic high level (logic 1) based on the logic high voltage threshold VIH and the logic low voltage threshold VIL.

Further, the single evaluation circuitry 70 may include hysteresis generation circuitry 300, 315 that is configured to provide an increased margin between the logic high voltage threshold VIH and the logic low voltage threshold VIL established by the first branch circuitry 1030. The hysteresis generation circuitry 300, 315 may include n-hysteresis generation circuitry 300 and p-hysteresis generation circuitry 315. The signal evaluation circuitry 70 may include Rx pull circuitry 285 (i.e., assist circuitry).

The receiver circuitry 15 may include signal conversion circuitry 80 that receives the intermediate signal F and provides an output signal (Output Y: Rxout: 85) for a second voltage domain (e.g., VDD) based on the intermediate signal F. In some implementations, the first voltage domain DVDD may refer to an input/output (I/O) voltage domain (or source voltage domain), and the second voltage domain VDD may refer to a core voltage domain (or destination voltage domain) operating at a level that may be less than the I/O voltage domain. Further, the second voltage domain VDD may be different than the first voltage domain DVDD. In some cases, the signal conversion circuitry 80 may include level down shifter circuitry 1036 and core buffer circuitry 1038. In some other cases, the intermediate signal F may be down converted by the level down shifter circuitry 1036 (formed with the NGT device 272) and the core buffer circuitry 1038 (formed with the inverters 274, 276) so as to provide the output signal (output Y) at the output within a voltage range associated with the destination voltage domain VDD. The signal conversion circuitry 80 may generate the output signal (output Y) at the output based on detecting when the input signal transitions between the logic low level (logic 0) and the logic high level (logic 1) by the signal evaluation circuitry 70. Further, the level down shifter circuitry 1036 may shift the signal domain from DVDD (3.3V/2.5V/1.8V) to VDD (0.85V). For instance, if the level down shifter circuitry 1036 receives a pulse input that is switching between 0V to DVDD, then it may give a same pulse output switching between 0V to VDD. The core buffer circuitry 1038 may include a chain of inverters (buffer stage of inverters, as shown in FIG. 4) that may be sized to easily drive higher loads and that may be used for duty cycle correction or adjustment in the VDD domain before driving the final output Y.

In some implementations, during operation of the receiver circuitry 15 shown in FIG. 9A, the input PAD 50 receives the input signal switching between 0V and DVDD, from which the multiple internal signals A2 for PMOSFETs and signal B2 for NMOSFETs are generated. In some cases, the first internal signal A2 may switch from (REF+|Vthp|) to DVDD, and the second internal signal B2 may switch from 0V to (REFN−Vthn). Both of the internal signals A2, B2 may be merged in the 1st branch 1030, where the transistors 230, 235 may be sized to meet JEDEC standard input thresholds (VIH/VIL) of the receiver circuitry 15. Further, in some cases, the first branch 1030 may provide multiple signals C (245) and D (240), which may be used in the second branch 1032 along with the Rx-pull circuitry 285 to correct dead zone and duty cycle degradation. Further, the intermediate signal F may be provided by the second branch that meets VIH/VIL along with a timing specification, which is then down level shifted by the signal conversion circuitry 80 to provide the output signal Y at the output. In some cases, when hysteresis is enabled, P-side hysteresis 315 may be introduced at node C (245), and N-side hysteresis 300 may be introduced at node D (240).

FIG. 9B illustrates signal waveforms for DC operation of the receiver circuitry 15 shown in FIG. 9A. For instance, in some cases, when the PAD value changes from 0V to 3.3V and again comes back to 0V, node A2 switches from 2.0V to 3.3V and returns to 2.0V following the PAD. Similarly, node B2 starts from 0V and reaches up to 1.3V when the PAD rises, again coming back to 0V once the PAD falls down. Further, as hysteresis is enabled, nodes F and Y change their states from logic 0 to 1 when the PAD is higher than 1.3V, and from logic 1 to 0 when PAD is less than 1.3V. In some cases, DC operation may work well with a lower bounded hysteresis of 165 mV, assuming threshold voltage (Vth) of NMOS and PMOS transistors are 0.5V.

FIG. 9C illustrates signal waveforms for AC operation of the receiver circuitry 15 shown in FIG. 9A. For instance, where the PAD is allowed to switch or change from 0V to 3.3V at 150 MHz frequency of operation, the voltage levels during transient behavior of node A2 and node B2 may not be the same as voltage levels in DC behavior shown in FIG. 9B. This may be due to the pass gate type of transistors. In some cases, as shown in FIG. 9C, node A2 may switch from 2.5V to 3.3V instead of 2.0V to 3.3V, because node A2 may not reach its stable value within the allowed time window of pulse duration (e.g., ~3.33 ns). Similarly, node B2 may switch from 0V to 0.8V instead of 1.3V. As a result of these small voltage values at node A2 and B2, the second branch 1032 may lose functionality. This problem may be severe when hysteresis is enabled, and because of low voltage swing available at nodes A2 and B2, and because of fighting between the hysteresis sections 300, 315 and the Rx pull section 285, the second branch states of the intermediate signal F may not flip. In one example, when 1 REFGEN cell (e.g., REFN and REFP generator 25) drives 10 BIDIR cells, and due to 10 BIDIR PADs switching, the coupling from PAD distorts the bias voltage REFN and REFP. Thus, in some cases, this swing or distortion at REFN and REFP may occur when 1 BIDIR receives a clock signal and 9 BIDIRS receive the inverse signal of the clock signal at their respective inputs. This distortion in REFN and REFP further deteriorates the intermediate signal F.

FIGS. 10-14 illustrate various diagrams related to overdrive receiver circuitry 15A with enhanced timing in accordance with implementations described herein.

Figure 10:
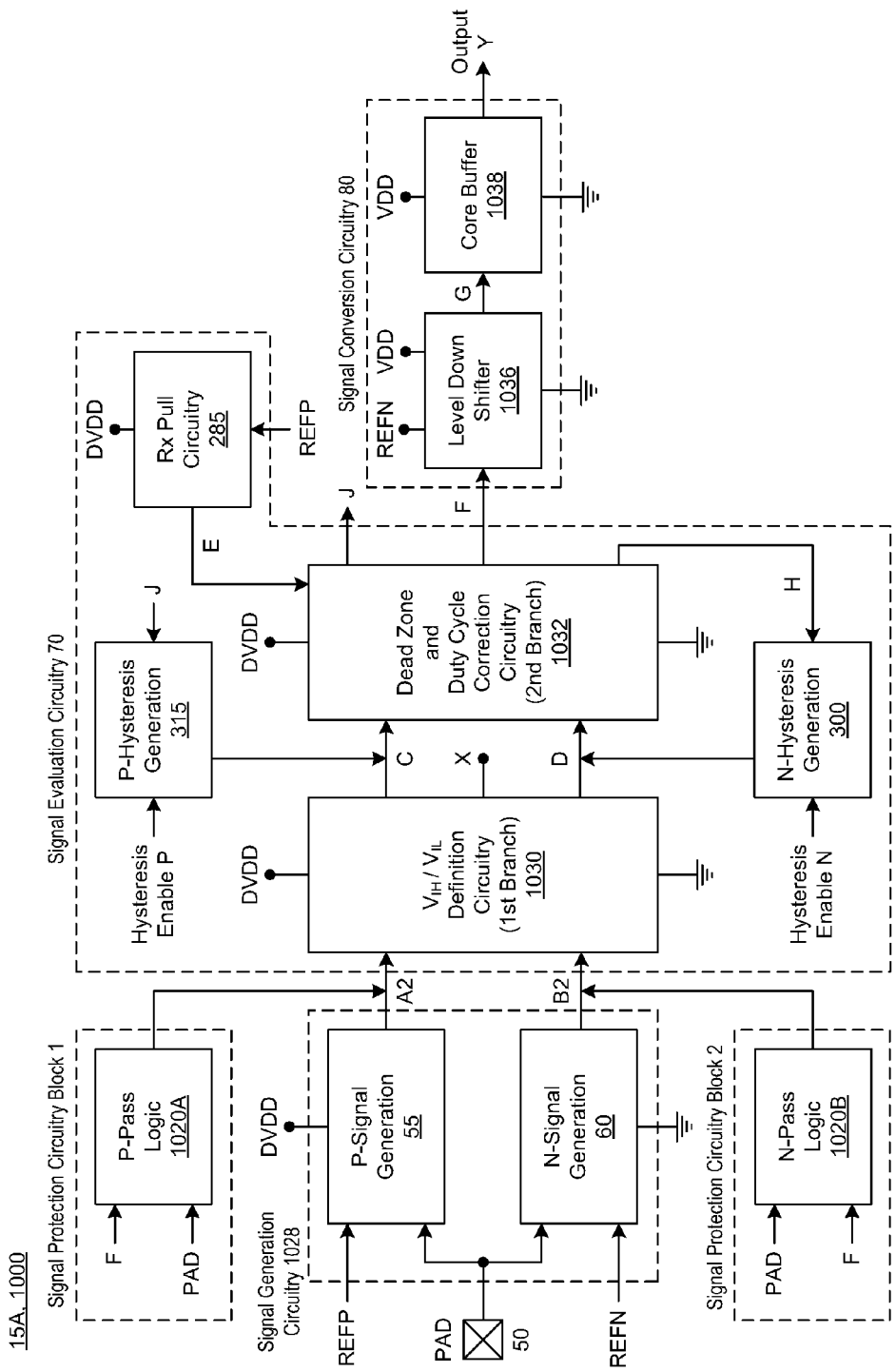
FIG. 10 illustrates a diagram of overdrive receiver circuitry having enhanced timing in accordance with various implementations described herein.

FIG. 10 illustrates another detailed diagram 1000 of the receiver circuitry 15, which may be referred to as overdrive receiver circuitry 15A in accordance with various implementations described herein. As shown in FIG. 10, the overdrive circuitry 15A of FIG. 10 is similar to the receiver circuitry 15 of FIG. 2 with inclusion of signal protection circuitry 1020A (block 1) and 1020B (block 2). In some implementations, as described herein, the overdrive receiver circuitry 15A of FIG. 10 provides for timing enhancement with inclusion of the signal protection circuitry 1020A (block 1) and 1020B (block 2).

As shown in FIG. 10, the signal protection circuitry 1020A, 1020B receives the input signal at the input PAD 50 from the first voltage domain DVDD, receives the intermediate signal F from the signal evaluation circuitry 70, and allows the input signal to pass to A2 and B2 until the intermediate signal F transitions between a first state and a second state that is different than the first state. In some cases, the signal protection circuitry 1020A, 1020B may include p-pass logic circuitry 1020A that receives the input signal from input PAD 50, receives the intermediate signal F from the signal evaluation circuitry 70, and allows the input signal within a first voltage range to pass to the signal evaluation circuitry based on a voltage level of the intermediate signal F. The first voltage range may be 1.5V to 3.3V at the first internal voltage node A2. Further, in some cases, the signal protection circuitry 1020A, 1020B may include n-pass logic circuitry 1020B that receives the input signal from input PAD 50, receives the intermediate signal F from the signal evaluation circuitry 70, and allows the input signal within a second voltage range, that is different than the first voltage range, to pass to the signal evaluation circuitry 70 based on the voltage level of the intermediate signal F. The second voltage range may be 0V to 1.8V at the second internal voltage node B2. As described in greater detail herein below, the p-pass logic circuitry 1020A and the n-pass logic circuitry 1020B may operate together to enhance timing behavior of the overdrive receiver circuitry 15A, e.g., under AC condition when the input signal is a high frequency input signal.

In some cases, when the input signal PAD 50 changes from the first state to the second state, block (1) 1020A of the signal protection circuitry may allow the input signal PAD 50 to pass to node A2 until the intermediate signal F changes its state from the first state to the second state. In some other cases, when the input signal PAD 50 changes from the second state to the first state, then block (2) 1020B of the signal protection circuitry may allow the input signal PAD 50 to pass to node B2 until the intermediate signal F changes its state from the second state to the first state. Further, the first state may refer to a logic high state, such as, e.g., a logical one (1) state, and the second state may refer to a logic low state, such as, e.g., a logical zero (0) state.

During operation, the overdrive receiver circuitry 15A of FIG. 10 may use one or more of the relationships as follows:

DVDD=>I/O supply (3.3V/2.5V/1.8V);

DVDDLO=>Intermediate 1.8V supply used for reliability;

VDD=>Core supply (0.85V);

VIH=>Minimum input voltage for detecting logic high;

VIL=>Maximum input voltage for detecting logic low;

REFN=>NMOS reference voltage may be same as DVDDLO; and

REFP=>PMOS reference voltage may be equal to (DVDD−REFN).

In some implementations, the receiver circuitry 15A of FIG. 10 may refer to an overdrive I/O receiver with enhanced timing characteristics. The overdrive I/O receiver 15A may receive an input signal at the input PAD 50 in the I/O voltage domain DVDD and level down shift that signal to core level VDD. In some cases, the overdrive I/O receiver may perform the receiving operation from an I/O level of 3.3V down to core level of 0.85V using 1.8V MOSFETs. As the technology supports maximum voltage difference of 1.8V across terminals of MOSFETs, so certain design techniques may be adopted to ensure reliability and no over voltage stress. The overdrive receiver circuitry 15A of FIGS. 10-14 may refer to an extension of the receiver circuitry 15 described in FIG. 1-9C, where timing behavior of the circuit is enhanced and which may even correct the functionality for processes with high threshold voltage Vth.

As shown in FIG. 10, the overdrive receiver circuitry 15A may include and utilize signal protection circuitry 1020A, 1020B, including P-pass logic 1020A (Block 1) and N-pass logic 1020B (Block 2) that allows PAD voltage to pass to the A2 and B2 nodes based on voltage level at node F. When PAD 50 switches from 0V to DVDD, and when the F node does not flip, then PAD value is allowed to pass to the B2 node until the node F flips to form logic 0 to logic 1. In another way, when PAD 50 changes from logic 1 to logic 0 and the node F does not fall to zero (0V), then the PAD voltage may be passed to node A2 until the node F changes its state to logic 0. In that way, the additional logic 1020A, 1020B may not impact the input thresholds (VIH/VIL) as the node F changes its state before nodes A2 and B2 reach to their stable values during DC operation. However, in AC condition, when nodes A2 and B2 do not have sufficient time to reach stable value (e.g., within half pulse duration), then the P-pass/N-pass circuitry 1020A, 1020B (Blocks 1 and 2) may allow the input PAD signal to reach node A2 and node B2 based on node F state until the node F switches. As such, in some cases, the signal protection circuitry 1020A, 1020B in blocks 1 and 2 may ensure that when the PAD 50 switches from 0V to 3.3V, then none of the components in the receiver circuitry 15A undergoes over voltage stress or terminal-to-terminal voltage of more than 1.8V (as technology supported). Hence, in some cases, during 3.3V/2.5V operation, the node B2 may be allowed to reach up to maximum voltage of REFN based on the PAD 50, instead of directly coupling the PAD 50 to the node B2. Similarly, in some cases, the node A2 may be allowed to fall up to REFP, instead of 0V, when the PAD changes state from 3.3V/2.5V to 0V instead of directly shorting the PAD 50 to node A2. In some implementations, the voltage range of the node A2 may be between 1.5V to 3.3V, and the voltage range of the node B2 may be between 0V to 1.8V.

Figure 11A:
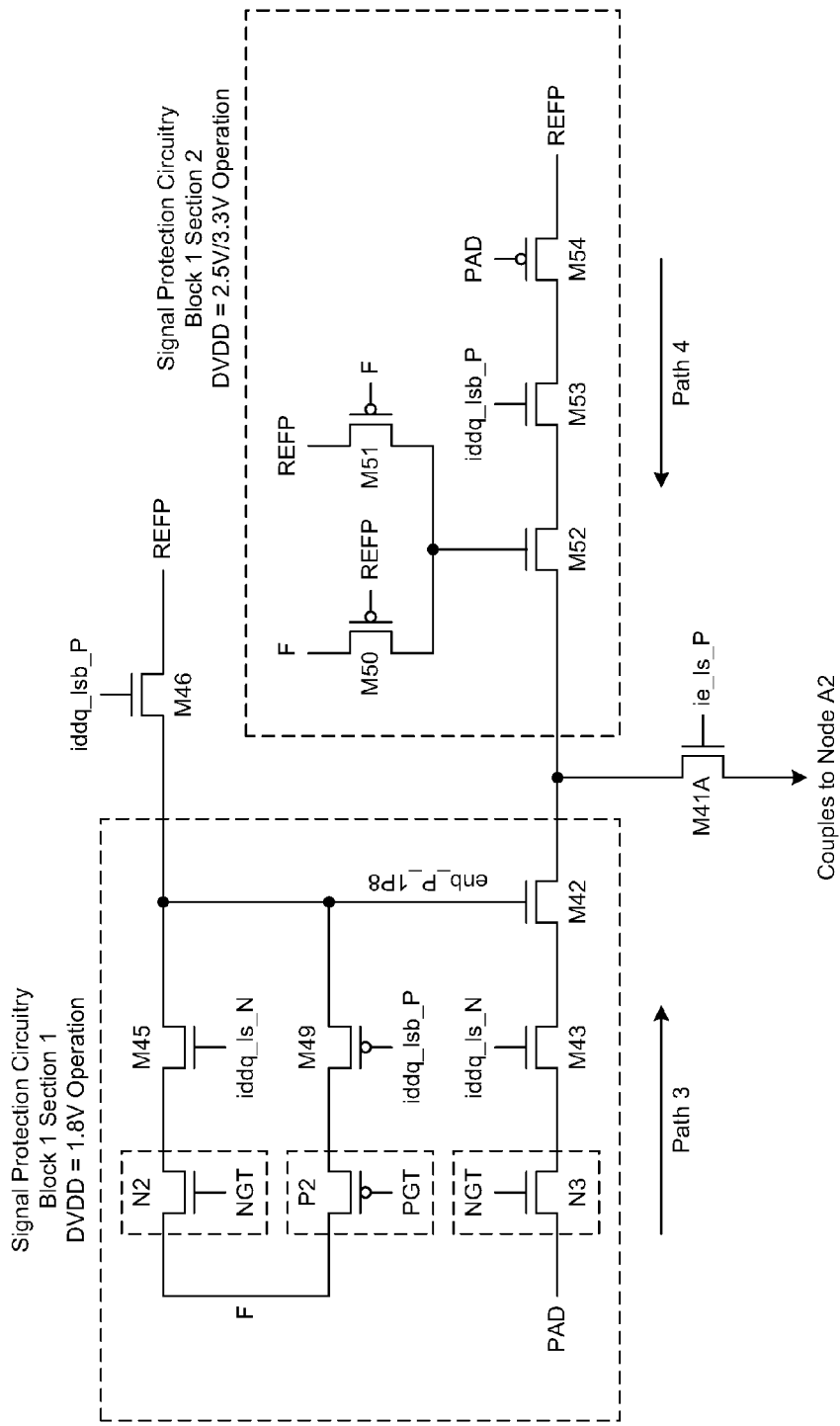
FIGS. 11A-11B illustrate more detailed views of the signal protection circuitry of the overdrive receiver circuitry of FIG. 10 in accordance with various implementations described herein.
Figure 11B:
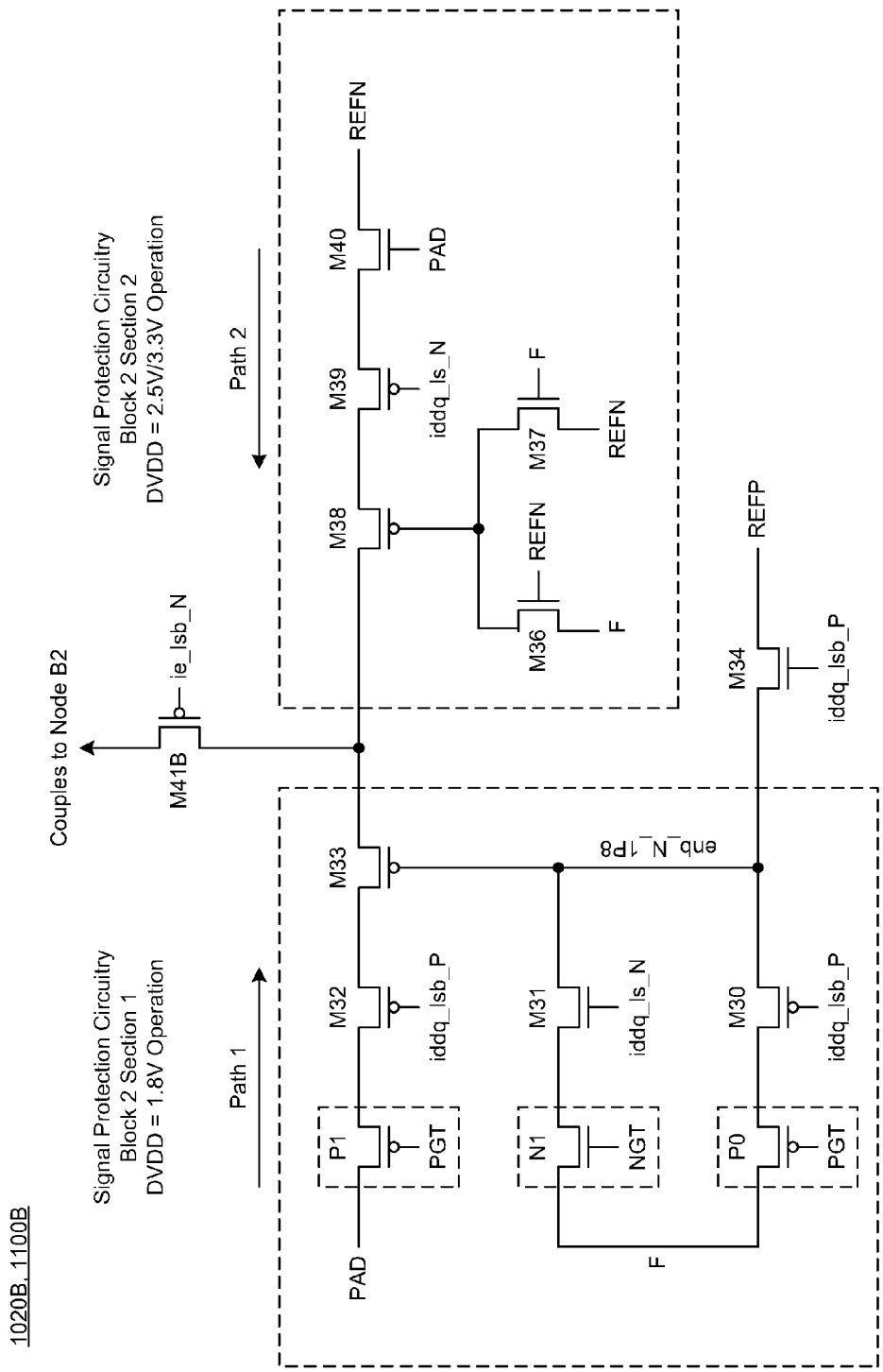

FIGS. 11A-11B illustrate more detailed views of the signal protection circuitry 1020A, 1020B of the overdrive receiver circuitry 15A of FIG. 10 in accordance with various implementations described herein. In particular, FIG. 11A illustrates a detailed view 1100A of the P-pass logic circuitry 1020A (Block 1) that is coupled to node A2, and FIG. 11B illustrates a detailed view 1100B of the N-pass logic circuitry 1020A (Block 2) that is coupled to node B2.

As shown in FIG. 11A, the P-pass logic circuitry 1020A (Block 1) may include multiple transistors and gate tracking circuits, including NMOS transistors M41A, M42, M43, M45, M46, M52, M53, PMOS transistors M49, M50, M51, M54, NGT circuits N2, N3, and PGT circuit P2. As shown, the transistors and gate tracking circuits may be arranged to receive input signals REFP, F and PAD and provide output signal to node A2.

As shown in FIG. 11B, the N-pass logic circuitry 1020B (Block 2) may include multiple transistors and gate tracking circuits, including NMOS transistors M31, M34, M36, M37, M40, PMOS transistors M30, M32, M33, M38, M39, M41B, NGT circuits N1, and PGT circuits P0, P1. As shown, the transistors and gate tracking circuits may be arranged to receive input signals REFN, REFP, F and PAD and provide output signal to node B2.

In some implementations, the N-pass logic circuitry 1020B of FIG. 11B may operate as follows. For DVDD=3.3V/2.5V operation (iddq_ls_n=0, iddq_lsb_p=DVDD, REFN=1.8V, REFP=[DVDD−REFN]), when node F is 0 and PAD changes from 0V to 3.3/2.5V, then node B2 is allowed to rise towards REFN based on the PAD value until node F flips its state. Once 'F' flips its state from 0 to 1, then the p-hysteresis circuit 315 is disabled and functionality issue is recovered. In another way, when node F is 1, and PAD changes from 3.3V/2.5V to 0V, then node A2 is allowed to follow PAD until node A2 reaches REFP or the state of node F changes from 1 to 0. When node F is changed from 1 to 0, then n-hysteresis circuit 300 is disabled. The PAD 50 may not be directly coupled to node A2 or B2 in 3.3V/2.5V domain. Otherwise, there may be voltage overstress across the MOSFET terminals. In some cases, path 1 is turned off by making the gate of M32 to DVDD (iddq_lsb_p) and gate of M33 to REFP by M34. Further, the gate of M33 is made equal to REFP to ensure reliability. In some cases, path 2 is turned on based on signal iddq_ls_N. If F is 0, then the gate of M38 is 0, thus node B2 slowly increases to REFN as the PAD increases. M40 ensures that as PAD increases, node B2 approaches to REFN. When F flips to DVDD, then M38 is turned off, which turns off path 2.

For DVDD=1.8V operation (iddq_ls_n=DVDD, iddq_lsb_p=0, REFN=1.8V, REFP=0), transistors M30 and M31 control the gate of M33 (to decide whether to pass PAD voltage to B or not). When node F is 0, then gate of M33 becomes 0, which creates a path for PAD (path 1) to node B2 through M41B. However, once node F flips state, then this path (path 1) is disabled so that it does not cause a trip point issue while PAD falls from DVDD to 0. Path 1 is disabled by making gate of M33=DVDD (1.8V). In this way, DC operation of Rx is untouched, and only AC operation is affected by this extra logic. In this condition, when DVDD=1.8V, M39 is switched off (iddq_ls_n=1.8V) so that path 2 does not turn on. In 1.8V operation, the PAD is directly coupled to node A2 or B2 based on node F value, as there may not be a reliability issue associated with it.

In some implementations, the P-pass logic circuitry 1020A of FIG. 11A may operate with a similar approach as followed for node A2. For instance, the P-pass logic circuitry 1020A may allow node A2 to follow the PAD, when the PAD starts falling from DVDD to 0, to ensure that node A2 reaches to its stable value during AC operation. The P-pass logic 1020A may ensure that DC operation is untouched and the AC operation is enhanced. In some cases, path 3 is turned on by making gate of M43 equal to 1.8V, when DVDD=1.8V. It allows node A2 to follow PAD, when PAD switches from DVDD to 0 and F is DVDD. When F flips to 0, path 3 is turned off by making gate of M42 to 0. Path 3 is also turned off during DVDD=2.5V/3.3V operation by making the gate of M43 to 0 (iddq_ls_N) and gate of M42 to REFP by M46. Further, the gate of M42 is made equal to REFP to ensure reliability. In some cases, path 4 is turned on based on signal iddq_lsb_P. If DVDD=2.3V/3.3V and F is DVDD, then the gate of M52 is DVDD, thus node A2 slowly decreases to REFP as the PAD decreases. M54 ensures that as PAD decreases, node A2 approaches to REFP. When F flips to 0, then M52 is turned off, which turns off path 4.

Further, in some cases, path 4 is also turned off when M53 becomes equal to REFP (iddq_lsb_P=REFP) in DVDD=1.8V operation.

In some implementations, the control signals that are used at the gates of the transistors are provided as follows:
  ie_lsb_N: receiver enable signal N-side;
  ie_lsb_N=REFN (1.8V), when receiver is disabled, ie_lsb_N=0 when receiver is enabled;
  iddq_ls_N: determines whether DVDD supply is operating at 1.8V domain or 2.5V-3.3V domain;
  iddq_ls_N=0, when DVDD=2.5V or 3.3V domain, and iddq_ls_N=REFN(1.8V), when DVDD=1.8V domain;
  iddq_lsb_P: iddq_lsb_P=DVDD, when DVDD=2.5V or 3.3V domain, and iddq_lsb_P=0, when DVDD=1.8V domain;
  ie_ls_P: receiver enable signal P-side;
  ie_ls_P=REFP, when receiver is disabled;
  ie_ls_P=DVDD, when receiver is enabled; and
  REFP=reference signal for PMOS=DVDD−REFN=1.5V (when DVDD=3.3V), or 0.7V (when DVDD=2.5V), or 0 (when DVDD=1.8V).

Figure 12A:
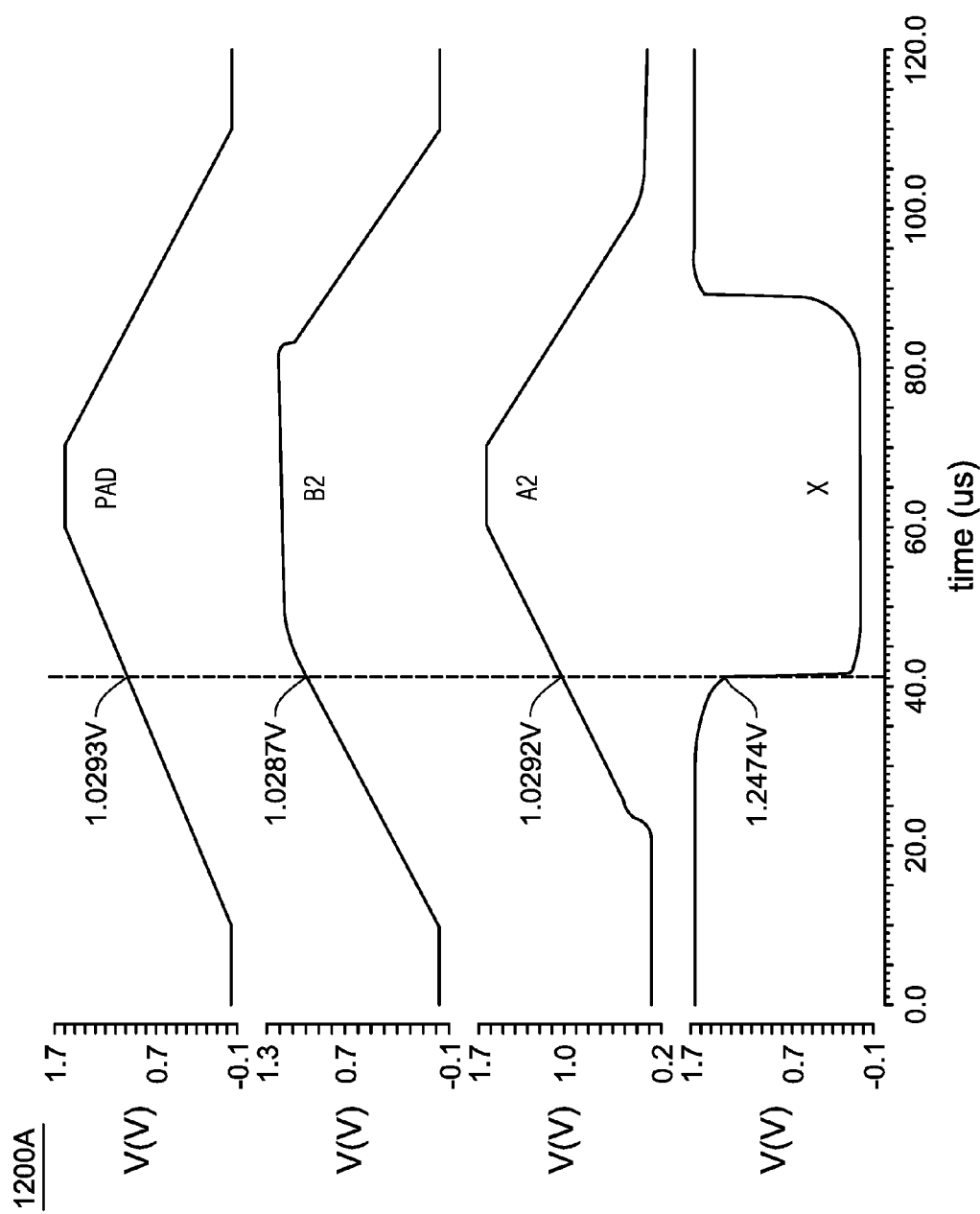
FIGS. 12A-12B illustrate signal diagrams that are provided with the receiver circuitry of FIG. 9A in accordance with various implementations described herein.
Figure 12B:
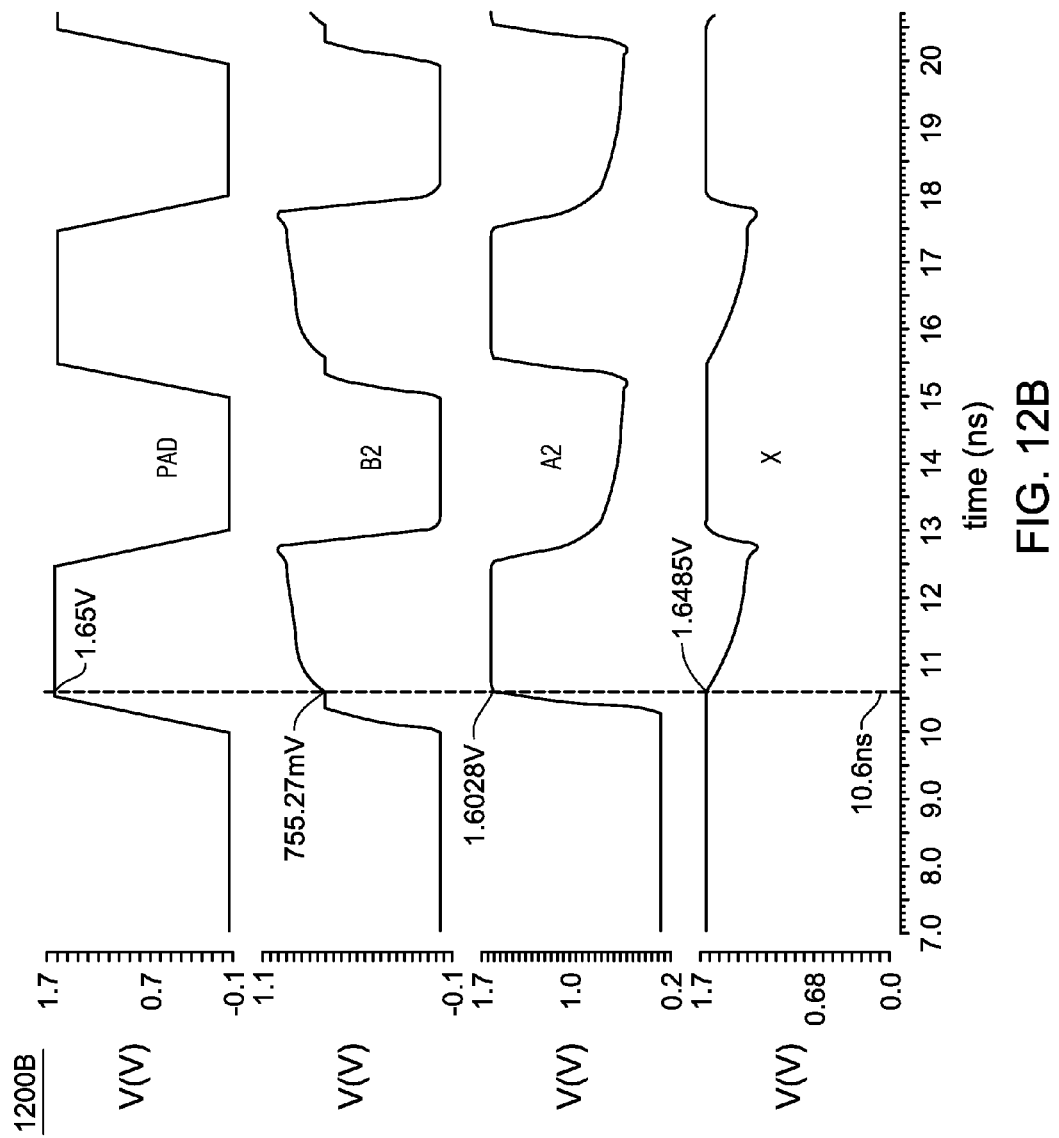

FIGS. 12A-12B illustrate various signal diagrams that are provided with the receiver circuitry 15 of FIG. 9A in accordance with various implementations described herein. In particular, FIG. 12A illustrates a signal diagram 1200A of the input PAD 50 and nodes A2, B2, X when the receiver circuitry 15 is operating in DC condition, and FIG. 12B illustrates another signal diagram 1200B of the input PAD 50 and nodes A2, B2, X when the receiver circuitry 15 is operating in AC condition. As shown in FIG. 12B, the signal at node X (opposite logic that of F) does not flip to 0 (low) when the PAD 50 and nodes A2, B2 are in the logic 1 state (high).

Figure 13A:
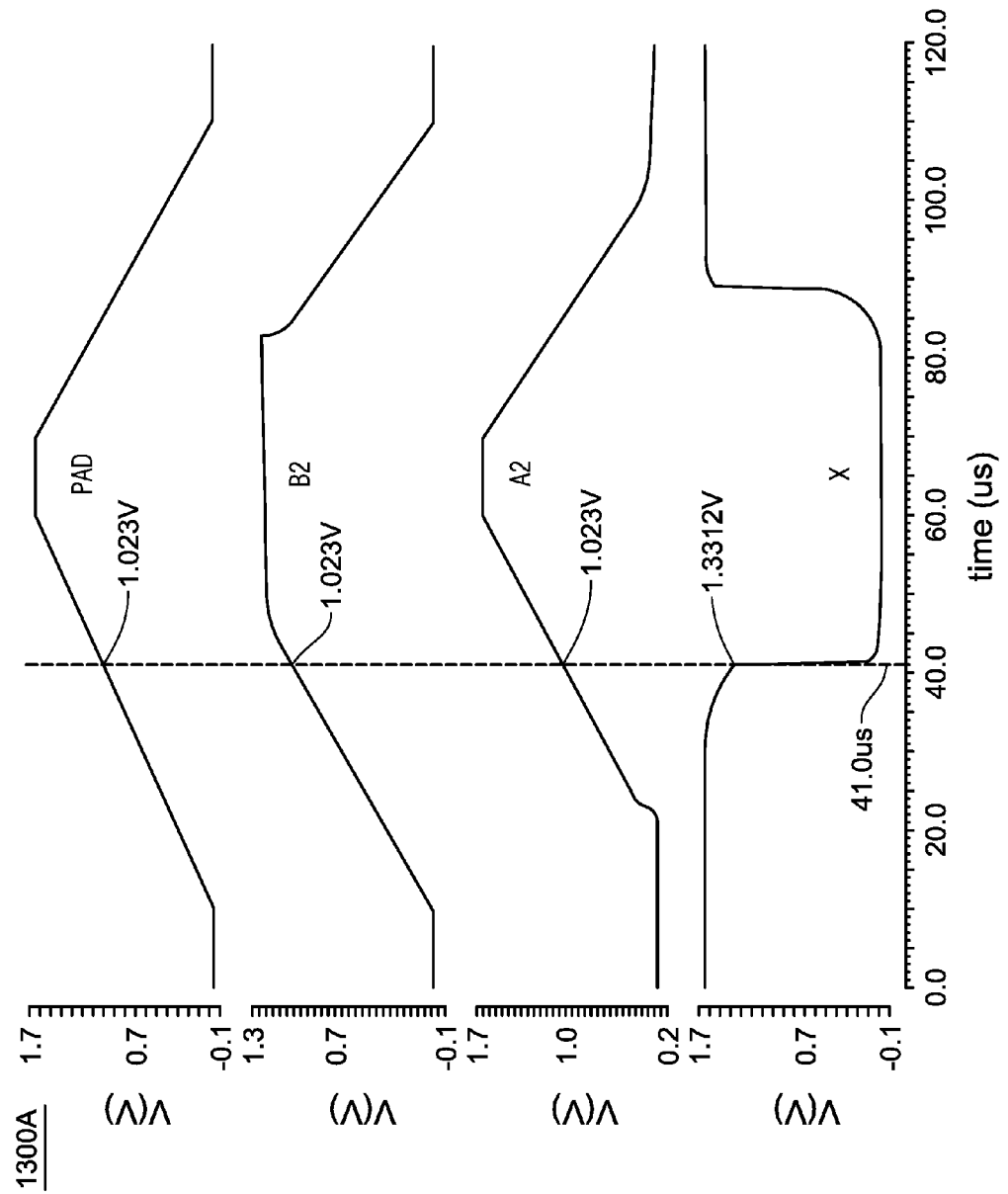
FIGS. 13A-13B illustrate signal diagrams that are provided with the overdrive receiver circuitry of FIG. 10 in accordance with implementations described herein.
Figure 13B:
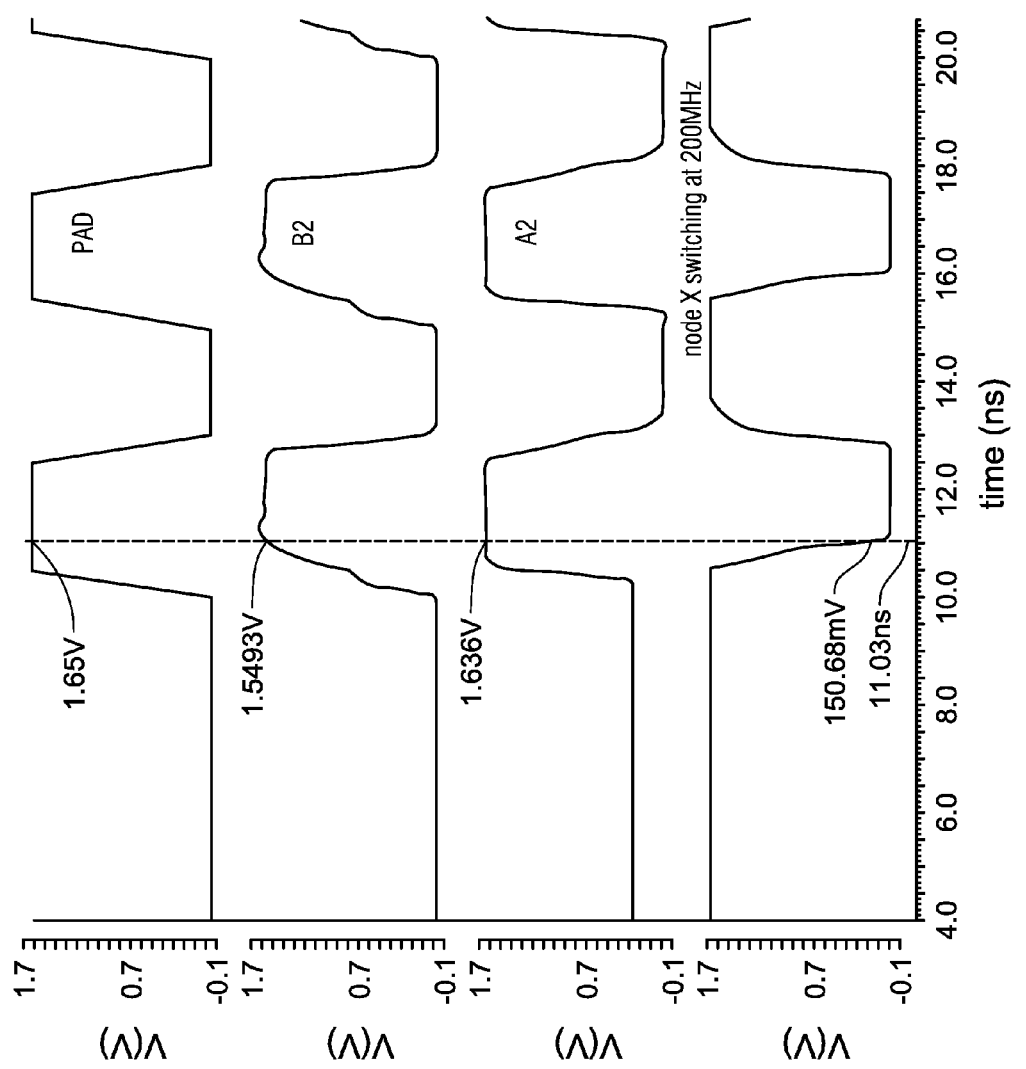

FIGS. 13A-13B illustrate various signal diagrams that are provided with the overdrive receiver circuitry 15A of FIG. 10 in accordance with various implementations described herein. In particular, FIG. 13A illustrates a signal diagram 1300A of the input PAD 50 and nodes A2, B2, X when the overdrive receiver circuitry 15A is operating in DC condition, and FIG. 13B illustrates another signal diagram 1300B of the input PAD 50 and nodes A2, B2, X when the receiver circuitry 15A is operating in AC condition. As shown in FIG. 13B, the signal at node X (opposite logic to that of F) does flip to 0 (low) when the PAD 50 and nodes A2, B2 are in the logic 1 state (high). In this instance, e.g., the AC condition may switch node X at 200 MHz.

Figure 14:
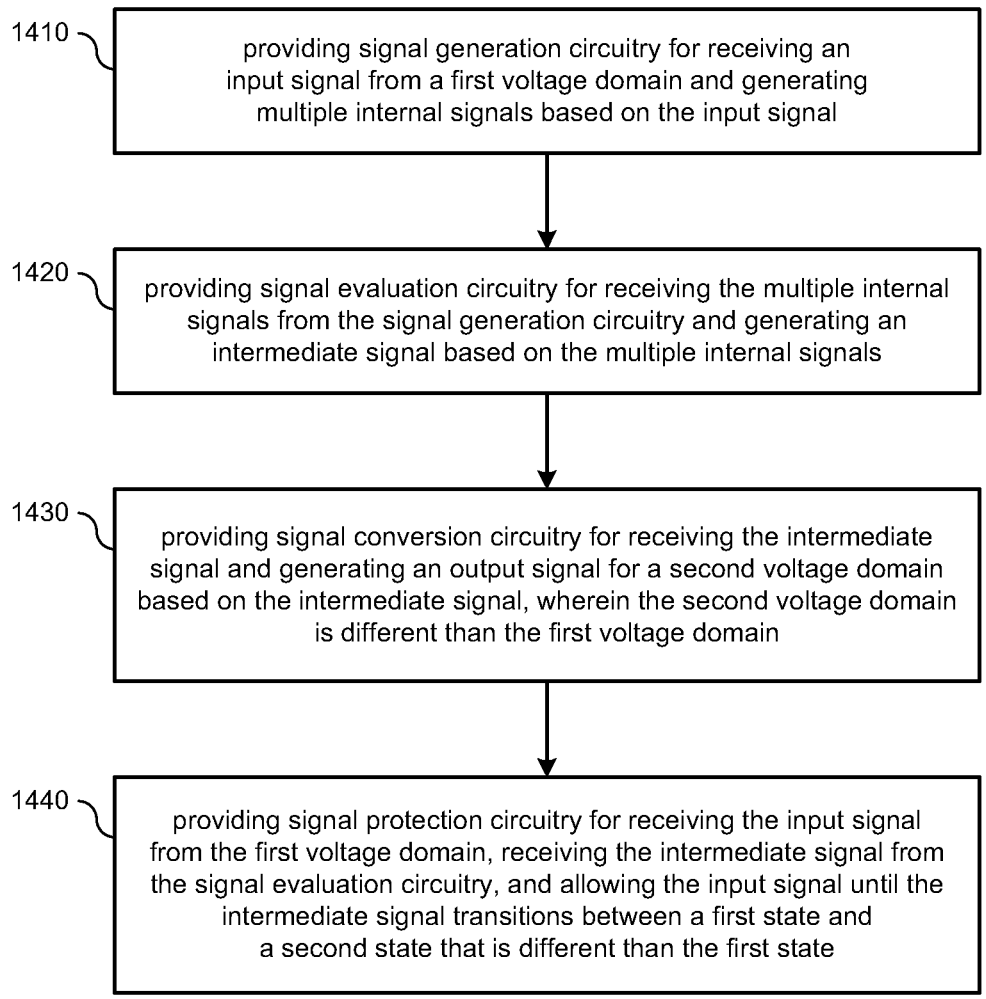
FIG. 14 illustrates a process flow diagram of a method of fabricating overdrive receiver circuitry in accordance with various implementations described herein.

FIG. 14 illustrates a process flow diagram of a method 1400 of fabricating receiver circuitry in accordance with various implementations described herein.

It should be understood that even though method 1400 may indicate a particular order of operation execution, in some cases, various certain portions of the operations may be executed in a different order, and on different systems. In some other cases, additional operations and/or steps may be added to and/or omitted from method 1400. Further, method 1400 may be implemented in hardware and/or software. If implemented in hardware, the method 1400 may be implemented with various circuit components, such as described herein above in reference to FIGS. 10-13. If implemented in software, the method 1400 may be implemented as a program or software instruction process that may be configured for fabricating, designing, and/or operating overdrive the overdrive receiver circuitry 15A as described herein. Further, if implemented in software, instructions related to implementing the method 1400 may be stored or recorded in various types of memory and/or a database. For instance, a computer or various other computing devices having a processor and memory may be configured to perform method 1400.

In reference to FIG. 14, method 1400 may be used for fabricating, designing, and/or operating overdrive receiver circuitry 15A of FIG. 10. In some implementations, at block 1410, method 1400 may provide signal generation circuitry for receiving an input signal from a first voltage domain and generating multiple internal signals based on the input signal. At block 1420, method 1400 may provide signal evaluation circuitry for receiving the multiple internal signals from the signal generation circuitry and generating an intermediate signal based on the multiple internal signals. At block 1430, method 1400 may provide signal conversion circuitry for receiving the intermediate signal and generating an output signal for a second voltage domain based on the intermediate signal, wherein the second voltage domain is different than the first voltage domain. Further, at block 1440, method 1400 may provide signal protection circuitry for receiving the input signal from the first voltage domain, receiving the intermediate signal from the signal evaluation circuitry, and allowing the input signal until the intermediate signal transitions between a first state and a second state that is different than the first state.

Described herein are various implementations of an integrated circuit. The integrated circuit may include signal generation circuitry that receives an input signal from a first voltage domain and generates multiple internal signals based on the input signal. The integrated circuit may include signal evaluation circuitry that receives the multiple internal signals from the signal generation circuitry and provides an intermediate signal based on the multiple internal signals. The integrated circuit may include signal conversion circuitry that receives the intermediate signal and provides an output signal for a second voltage domain based on the intermediate signal. The second voltage domain may be different than the first voltage domain. The integrated circuit may include signal protection circuitry that receives the input signal from the first voltage domain, receives the intermediate signal from the signal evaluation circuitry, and allows the input signal until the intermediate signal transitions between a first state and a second state that is different than the first state.

Described herein are various implementations of an integrated circuit. The integrated circuit may include receiver circuitry that receives an input signal from a source voltage domain and converts the input signal into an output signal for a destination voltage domain. The source voltage domain may operate from a supply voltage that exceeds a stressing threshold of components within the receiver circuitry. The receiver circuitry may generate multiple internal signals based on the input signal, generate an intermediate signal based on the multiple internal signals, and generate the output signal based on the intermediate signal. The integrated circuit may include signal protection circuitry that receives the input signal from the source voltage domain, receives the intermediate signal from the receiver circuitry, and allows the input signal until the intermediate signal transitions between a first state and a second state that is different than the first state.

Described herein are various implementations of a method of operating an integrated circuit. The method may include providing signal generation circuitry for receiving an input signal from a first voltage domain and generating multiple internal signals based on the input signal. The method may include providing signal evaluation circuitry for receiving the multiple internal signals from the signal generation circuitry and generating an intermediate signal based on the multiple internal signals. The method may include providing signal conversion circuitry for receiving the intermediate signal and generating an output signal for a second voltage domain based on the intermediate signal. The second voltage domain may be different than the first voltage domain. The method may include providing signal protection circuitry for receiving the input signal from the first voltage domain, receiving the intermediate signal from the signal evaluation circuitry, and allowing the input signal until the intermediate signal transitions between a first state and a second state that is different than the first state.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, instances of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For instance, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as instance forms of implementing the claims.

What is claimed is:

1. An integrated circuit, comprising:
   signal generation circuitry that receives an input signal from a first voltage domain and generates multiple internal signals based on the input signal;
   signal evaluation circuitry that receives the multiple internal signals from the signal generation circuitry and provides an intermediate signal based on the multiple internal signals;
   signal conversion circuitry that receives the intermediate signal and provides an output signal for a second voltage domain based on the intermediate signal, wherein the second voltage domain is different than the first voltage domain; and
   signal protection circuitry that receives the input signal from the first voltage domain, receives the intermediate signal from the signal evaluation circuitry, and allows the input signal to pass until the intermediate signal transitions between a first state and a second state that is different than the first state, wherein the signal protection circuitry comprises p-pass logic circuitry that receives the input signal and the intermediate signal and allows the input signal within a first voltage range to pass to the signal evaluation circuitry based on a voltage level of the intermediate signal.

2. The integrated circuit of claim 1, wherein the first voltage domain comprises an input/output (I/O) voltage domain, and wherein the second voltage domain comprises a core voltage domain operating at a level that is less than the I/O voltage domain.

3. The integrated circuit of claim 1, wherein:
   the signal generation circuitry comprises p-signal generation circuitry that receives the input signal and a p-reference signal, generates a first internal signal of the multiple internal signals based on the input signal and the p-reference signal, and provides the first internal signal to the signal evaluation circuitry, and
   the signal generation circuitry comprises n-signal generation circuitry that receives the input signal and an n-reference signal, generates a second internal signal of the multiple internal signals based on the input signal and the n-reference signal, and provides the second internal signal to the signal evaluation circuitry.

4. An integrated circuit comprising:
signal generation circuitry that receives an input signal from a first voltage domain and generates multiple internal signals based on the input signal;
signal evaluation circuitry that receives the multiple internal signals from the signal generation circuitry and provides an intermediate signal based on the multiple internal signals;
signal conversion circuitry that receives the intermediate signal and provides an output signal for a second voltage domain based on the intermediate signal, wherein the second voltage domain is different than the first voltage domain;
signal protection circuitry that receives the input signal from the first voltage domain, receives the intermediate signal from the signal evaluation circuitry, and allows the input signal to pass until the intermediate signal transitions between a first state and a second state that is different than the first state, wherein the signal protection circuitry comprises n-pass logic circuitry that receives the input signal and the intermediate signal and allows the input signal within a voltage range to pass to the signal evaluation circuitry based on the voltage level of the intermediate signal; and
control signal generation circuitry that generates multiple reference signals including a p-reference signal and an n-reference signal;
wherein
the signal generation circuitry comprises p-signal generation circuitry that receives the input signal and the p-reference signal, generates a first internal signal of the multiple internal signals based on the input signal and the p-reference signal, and provides the first internal signal to the signal evaluation circuitry, and
the signal generation circuitry comprises n-signal generation circuitry that receives the input signal and the n-reference signal, generates a second internal signal of the multiple internal signals based on the input signal and the n-reference signal, and provides the second internal signal to the signal evaluation circuitry.

5. The integrated circuit of claim 1, wherein:
the signal evaluation circuitry establishes a logic high voltage threshold and a logic low voltage threshold based on the input signal, and
the signal evaluation circuitry employs the multiple internal signals to detect when the input signal transitions between a logic low level and a logic high level based on the logic high voltage threshold and the logic low voltage threshold.

6. The integrated circuit of claim 5, wherein the signal conversion circuitry generates the output signal based on detecting when the input signal transitions between the logic low level and the logic high level by the signal evaluation circuitry.

7. An integrated circuit comprising:
signal generation circuitry that receives an input signal from a first voltage domain and generates multiple internal signals based on the input signal;
signal evaluation circuitry that receives the multiple internal signals from the signal generation circuitry and provides an intermediate signal based on the multiple internal signals;
signal conversion circuitry that receives the intermediate signal and provides an output signal for a second voltage domain based on the intermediate signal, wherein the second voltage domain is different than the first voltage domain; and
signal protection circuitry that receives the input signal from the first voltage domain, receives the intermediate signal from the signal evaluation circuitry, and allows the input signal to pass until the intermediate signal transitions between a first state and a second state that is different than the first state;
wherein
the signal evaluation circuitry establishes a logic high voltage threshold and a logic low voltage threshold based on the input signal, and
the signal evaluation circuitry employs the multiple internal signals to detect when the input signal transitions between a logic low level and a logic high level based on the logic high voltage threshold and the logic low voltage threshold; and
wherein the signal evaluation circuitry comprises:
first branch circuitry that receives the multiple internal signals from the signal generation circuitry and establishes the logic high voltage threshold and the logic low voltage threshold based on the input signal;
second branch circuitry that receives the multiple internal signals, corrects dead zone and duty cycle degradation of the multiple internal signals, and provides the intermediate signal based in the corrected multiple internal signals, and
hysteresis generation circuitry configured to provide an increased margin between the logic high voltage threshold and the logic low voltage threshold established by the first branch circuitry.

8. The integrated circuit of claim 1, wherein the signal conversion circuitry comprises level down shifter circuitry and core buffer circuitry that are arranged to receive and down shift the intermediate signal to a level of the output signal for the second voltage domain.

9. The integrated circuit of claim 1, wherein the signal protection circuitry allows the input signal to pass until the intermediate signal transitions in a first direction from the first state to the second state.

10. An integrated circuit comprising:
signal generation circuitry that receives an input signal from a first voltage domain and generates multiple internal signals based on the input signal;
signal evaluation circuitry that receives the multiple internal signals from the signal generation circuitry and provides an intermediate signal based on the multiple internal signals;
signal conversion circuitry that receives the intermediate signal and provides an output signal for a second voltage domain based on the intermediate signal, wherein the second voltage domain is different than the first voltage domain; and
signal protection circuitry that receives the input signal from the first voltage domain, receives the intermediate signal from the signal evaluation circuitry, and allows the input signal to pass until the intermediate signal transitions between a first state and a second state that is different than the first state;
wherein the signal protection circuitry allows the input signal to pass until the intermediate signal transitions in a first direction from the first state to the second state; and
wherein the signal protection circuitry allows the input signal to pass in a second direction until the intermediate signal transitions from the second state to the first state, wherein the second direction is opposite of the first direction.

11. The integrated circuit of claim 1, wherein:
the first state comprises a logic high state including a logical one (1) state, and
the second state comprises a logic low state including a logical zero (0) state.

12. The integrated circuit of claim 1, wherein:
the signal protection circuitry comprises n-pass logic circuitry that receives the input signal and the intermediate signal and allows the input signal within a second voltage range, that is different than the first voltage range, to pass to the signal evaluation circuitry based on the voltage level of the intermediate signal.

13. The integrated circuit of claim 12, wherein the p-pass logic circuitry and the n-pass logic circuitry operate together to enhance timing behavior of the integrated circuit under AC condition when the input signal is a high frequency input signal.

14. An integrated circuit, comprising:
receiver circuitry that receives an input signal from a source voltage domain and converts the input signal into an output signal for a destination voltage domain, wherein the source voltage domain operates from a supply voltage that exceeds a stressing threshold of components within the receiver circuitry, and wherein the receiver circuitry generates multiple internal signals based on the input signal, generates an intermediate signal based on the multiple internal signals, and generates the output signal based on the intermediate signal,
wherein the receiver circuitry comprises:
signal generation circuitry that receives the input signal from the source voltage domain and generates the multiple internal signals based on the input signal;
signal evaluation circuitry that receives the multiple internal signals from the signal generation circuitry and provides the intermediate signal based on the multiple internal signals; and
signal conversion circuitry that receives the intermediate signal and provides the output signal for the destination voltage domain based on the intermediate signal, wherein the second voltage domain is different than the first voltage domain; and
signal protection circuitry that receives the input signal from the source voltage domain, receives the intermediate signal from the receiver circuitry, and allows the input signal to pass until the intermediate signal transitions between a first state and a second state that is different than the first state, wherein the signal protection circuitry comprises p-pass logic circuitry that receives the input signal and the intermediate signal and allows the input signal within a first voltage range to pass to the signal evaluation circuitry based on a voltage level of the intermediate signal.

15. The integrated circuit of claim 14, wherein:
the source voltage domain comprises an input/output (I/O) voltage domain, and
the destination voltage domain comprises a core voltage domain operating at a level that is less than the I/O voltage domain.

16. The integrated circuit of claim 14, wherein:
the signal generation circuitry comprises p-signal generation circuitry that receives the input signal and a p-reference signal, generates a first internal signal of the multiple internal signals based on the input signal and the p-reference signal, and provides the first internal signal to the signal evaluation circuitry, and
the signal generation circuitry comprises n-signal generation circuitry that receives the input signal and an n-reference signal, generates a second internal signal of the multiple internal signals based on the input signal and the n-reference signal, and provides the second internal signal to the signal evaluation circuitry.

17. The integrated circuit of claim 14, wherein:
the signal protection circuitry comprises n-pass logic circuitry that receives the input signal and the intermediate signal and allows the input signal within a second voltage range, that is different than the first voltage range, to pass to the signal evaluation circuitry based on the voltage level of the intermediate signal.

18. The integrated circuit of claim 14, wherein:
the first state comprises a logic high state including a logical one (1) state, and
the second state comprises a logic low state including a logical zero (0) state.

19. A method of operating an integrated circuit, the method comprising:
providing signal generation circuitry for receiving an input signal from a first voltage domain and generating multiple internal signals based on the input signal;
providing signal evaluation circuitry for receiving the multiple internal signals from the signal generation circuitry and generating an intermediate signal based on the multiple internal signals;
providing signal conversion circuitry for receiving the intermediate signal and generating an output signal for a second voltage domain based on the intermediate signal, wherein the second voltage domain is different than the first voltage domain; and
providing signal protection circuitry for receiving the input signal from the first voltage domain, receiving the intermediate signal from the signal evaluation circuitry, and allowing the input signal to pass until the intermediate signal transitions between a first state and a second state that is different than the first state, wherein the signal protection circuitry comprises p-pass logic circuitry that receives the input signal and the intermediate signal and allows the input signal within a first voltage range to pass to the signal evaluation circuitry based on a voltage level of the intermediate signal.

20. The integrated circuit of claim 4, wherein the signal protection circuitry comprises p-pass logic circuitry that receives the input signal and the intermediate signal and allows the input signal within another voltage range that is different than the voltage range to pass to the signal evaluation circuitry based on a voltage level of the intermediate signal.

21. The integrated circuit of claim 20, wherein the another voltage range comprises 1.5V to 3.3V.

22. The integrated circuit of claim 4, wherein the voltage range comprises 0V to 1.8V.

* * * * *